US010116313B2

(12) United States Patent
Srivastava

(10) Patent No.: US 10,116,313 B2
(45) Date of Patent: Oct. 30, 2018

(54) APPARATUS AND METHOD TO MITIGATE PHASE AND FREQUENCY MODULATION DUE TO INDUCTIVE COUPLING

(71) Applicant: Intel Corporation, Santa Clara, CA (US)

(72) Inventor: Amit Kumar Srivastava, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/835,656

(22) Filed: Aug. 25, 2015

(65) Prior Publication Data
US 2017/0063382 A1  Mar. 2, 2017

(51) Int. Cl.
H03L 7/00 (2006.01)
H03L 7/08 (2006.01)
H03L 7/06 (2006.01)
H03L 7/087 (2006.01)
H03L 7/089 (2006.01)
H03L 7/07 (2006.01)
H03L 7/23 (2006.01)
H03L 7/197 (2006.01)
H03M 1/50 (2006.01)

(52) U.S. Cl.
CPC ............... *H03L 7/087* (2013.01); *H03L 7/23* (2013.01); *H03L 7/235* (2013.01); *H03L 7/1976* (2013.01); *H03M 1/50* (2013.01)

(58) Field of Classification Search
CPC . H03L 7/07; H03L 7/091; H03L 7/095; H04L 7/00; H03D 3/24

USPC .............. 327/2–12, 105–123, 141, 144–163; 331/15–17; 375/373–376
See application file for complete search history.

(56) References Cited

U.S. PATENT DOCUMENTS 5,521,948 A *  5/1996  Takeuchi .............. H03L 7/1974
                                                    331/11
5,610,558 A *  3/1997  Mittel ..................... H03L 7/07
                                                    327/147
5,939,912 A *  8/1999  Rehm ...................... H03L 7/07
                                                    327/158
6,463,013 B1* 10/2002  Liu ........................... G06F 1/06
                                                    327/156
6,636,575 B1* 10/2003  Ott ........................... H03L 7/07
                                                    327/149

(Continued)

FOREIGN PATENT DOCUMENTS

WO       2015084335       1/2015

OTHER PUBLICATIONS

International Search Report & Written Opinion, dated Oct. 21, 2016, for PCT Patent Application No. PCT/US2016/042845.

(Continued)

*Primary Examiner* — Brandon S Cole
(74) *Attorney, Agent, or Firm* — Green, Howard & Mughal LLP

(57) ABSTRACT

Described is an apparatus which comprises: a first clocking source having a first divider; a second clocking source having a second divider, wherein the first and second clocking sources are inductively coupled; and calibration logic to monitor clock signals associated with the first and second clocking sources and to generate at least one calibration code for adjusting at least one divider ratio of the first or second dividers according to the monitored clock signals.

24 Claims, 17 Drawing Sheets

(56) References Cited

U.S. PATENT DOCUMENTS

| | | | | |
|---|---|---|---|---|
| 6,920,622 | B1* | 7/2005 | Garlepp | H03L 7/081 327/147 |
| 7,522,690 | B2* | 4/2009 | Zhang | H03L 7/087 375/147 |
| 7,557,627 | B2* | 7/2009 | Lee | G11C 7/22 327/158 |
| 8,384,453 | B1* | 2/2013 | Caviglia | H03L 7/1976 327/147 |
| 9,007,131 | B2* | 4/2015 | Mirzaei | H03L 7/085 327/156 |
| 9,660,797 | B2* | 5/2017 | Zhu | H04L 7/033 |
| 2001/0048329 | A1* | 12/2001 | Sumi | H03L 7/087 327/156 |
| 2002/0030518 | A1* | 3/2002 | Dauth | H03L 7/23 327/156 |
| 2006/0055466 | A1* | 3/2006 | Hirano | H03C 3/0925 331/16 |
| 2006/0056561 | A1* | 3/2006 | Zhang | H03L 7/087 375/376 |
| 2007/0103214 | A1* | 5/2007 | Drexler | H03L 7/07 327/156 |
| 2008/0111597 | A1* | 5/2008 | Cranford | H03L 7/07 327/156 |
| 2008/0174373 | A1* | 7/2008 | Dai | H03L 7/189 331/2 |
| 2009/0156150 | A1* | 6/2009 | Deleon | H03L 7/183 455/260 |
| 2010/0013531 | A1* | 1/2010 | Ainspan | H03L 7/093 327/159 |
| 2010/0123491 | A1* | 5/2010 | Palmer | H03L 7/07 327/156 |
| 2010/0142003 | A1* | 6/2010 | Braun | H04N 1/32309 358/3.28 |
| 2011/0248755 | A1* | 10/2011 | Hasenplaugh | H03L 7/087 327/157 |
| 2011/0298506 | A1* | 12/2011 | Salle | G01S 7/032 327/156 |
| 2013/0076415 | A1 | 3/2013 | Hara et al. | |
| 2013/0307613 | A1 | 11/2013 | Tham | |
| 2014/0370882 | A1 | 12/2014 | Liu et al. | |
| 2015/0084676 | A1* | 3/2015 | McLaurin | H03L 7/085 327/142 |
| 2015/0110233 | A1 | 4/2015 | Azenkot et al. | |
| 2015/0145612 | A1* | 5/2015 | Lu | H03B 1/00 331/117 R |
| 2015/0155877 | A1* | 6/2015 | Yang | H03L 7/085 327/157 |
| 2015/0214966 | A1* | 7/2015 | Tong | H03L 7/0898 327/157 |
| 2015/0263742 | A1* | 9/2015 | McLaurin | H03L 7/085 327/158 |

OTHER PUBLICATIONS

International Preliminary Report on Patentability from PCT/US2016/042845 notified Mar. 8, 2018, 12 pgs.

* cited by examiner

APPARATUS AND METHOD TO MITIGATE PHASE AND FREQUENCY MODULATION DUE TO INDUCTIVE COUPLING

BACKGROUND

A processor may have many clocking sources such as phase locked loops (PLLs). For example, in highly integrated System-on-Chips (SoCs), many different types of input-output (I/O) transceivers (or I/Os) are used. These I/Os may require clock signals of different clocking frequencies with low jitter (i.e., high performance clock signals). To achieve low jitter clock signals, inductor-capacitor (LC) PLLs are commonly used. To provide different clocking frequencies, multiple LCPLLs may be used. For example, a first I/O band having multiple I/Os may require a clock with 2.5 GHz frequency and a second I/O band abutting the first I/O band may have multiple I/Os requiring a clock with 2.38 GHz frequency.

However, in tightly packed SoCs where circuits and modules are very close to one another, close proximity of clocking sources is no surprise. When clocking sources such as LCPLLs are close to one another (e.g., in the case of clock sources of abutting I/O bands), the clock sources experience inductive coupling which causes the output frequency of the LCPLLs to drift away from their intended steady state frequency. One way to mitigate the inductive coupling is to separate the LCPLLs by a large distance (e.g., 200 μm or more). However, such a solution is not practical because it increases area of the integrated circuit.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
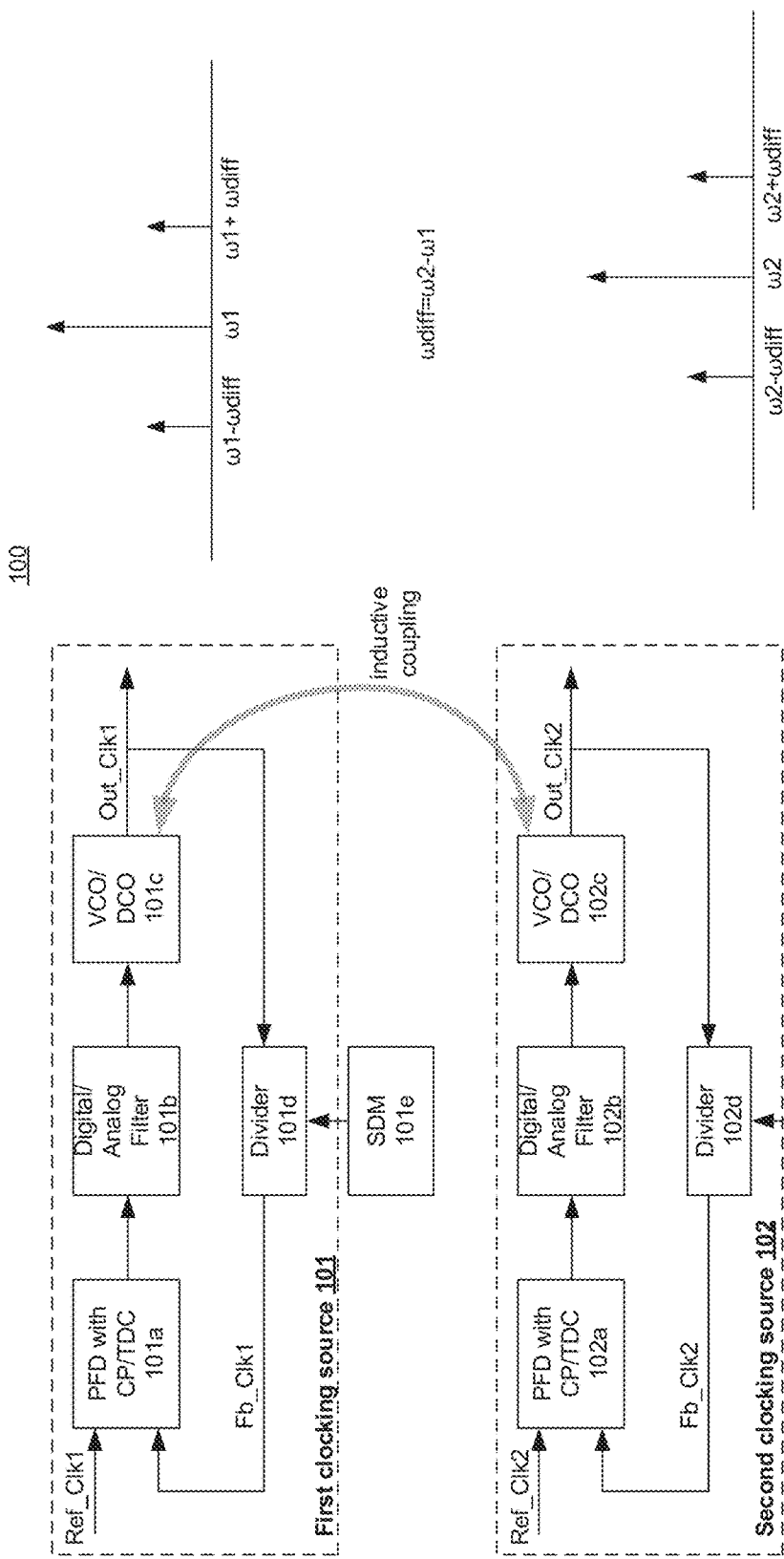
FIG. 1 illustrates a clocking system with at least two phase locked loops (PLLs) which are inductively coupled causing drift in beat frequencies of the at least two PLLs.

FIG. 1 illustrates a clocking system 100 with at least two phase locked loops (PLLs) which are in such close proximity so that they are inductively coupled causing drift in beat frequencies of the at least two PLLs. In this example, clocking system 100 shows two clocking sources—First clocking source 101 (e.g., PLL1) and Second clocking source 102 (e.g., PLL2)—and sigma-delta modulators (SDM) SDM 101e and 102e. Here, PLL1 101 is formed of a phase frequency detector (PFD) with Charge Pump (CP) or Time-to-Digital Converter (TDC) 101a, Analog or Digital Filter 101b, Voltage Controlled Oscillator (VCO) or Digital Controlled Oscillator 101c, and Divider 101d. PLL2 102 is formed of Phase frequency Detector (PFD) with Charge Pump or TDC 102a, Analog or Digital Filter 102b, VCO or DCO 102c, and Divider 102d.

PLL1 101 receives a first reference clock (Ref_Clk1) and compares it with a first feedback clock (Fb_Clk1) and adjusts the frequency/delay characteristics of VCO 101c till the phases of Ref_Clk1 and Fb_Clk1 are aligned. The output of PLL1 101 is Out_Clk1 with a central frequency of ω1 (e.g., 2.5 Hz). The divider ratio of Divider 101d may be modulated by the output of SDM 101e to shape out of band noise. PLL2 102 may be identical or different from PLL 101. In this example, PLL2 102 receives a first reference clock (Ref_Clk2) and compares it with a first feedback clock (Fb_Clk2) and adjusts the frequency/delay characteristics of VCO 102c till the phases of Ref_Clk2 and Fb_Clk2 are aligned. The output of PLL2 102 is Out_Clk2 with a central frequency of ω2 (e.g., 2.38 GHz), which is slightly different from central frequency of ω1 and or very close to frequency ω1. The divider ratio of Divider 102d may be modulated by the output of SDM 102e to shape out of band noise. Because of inductive coupling, unwanted sideband frequencies appear on the frequency spectrum of Out_Clk1 and Out_Clk2.

For example, the frequency spectrum of Out_Clk1 sees sideband frequencies of ω1−ωdiff and ω1+ωdiff while the frequency spectrum of Out_Clk2 sees sideband frequencies of ω2−ωdiff and ω2+ωdiff, where ωdiff=|ω1−ω2|. Here, ωdiff is the beat frequency. When two output clocks of different frequency are inductively coupled, the alternating constructive and destructive interference causes sideband frequencies (i.e., noise) in the output clocks, and this phenomenon is called "beating" or producing beats. These sideband frequencies introduce timing errors in the circuits causing critical timing paths and failures. Close proximity of the PLLs may also introduce other noise couplings. For example, noise such as power supply noise induced by inductive coupling and large signal coupling that causes amplitude to phase modulation may be introduced from close proximity of the PLLs.

Figure 2A:
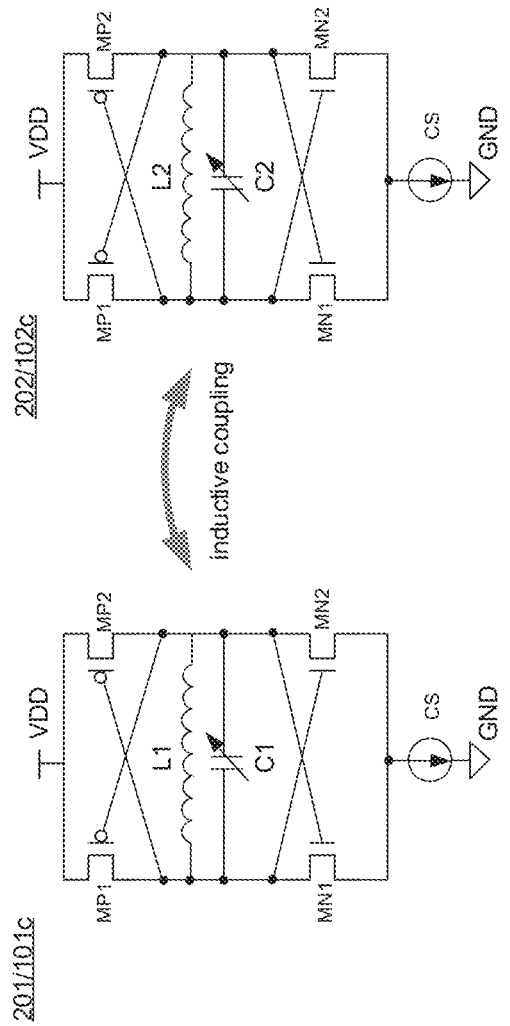
FIG. 2A illustrates two inductor-capacitor (LC) oscillators that are inductively coupled causing drift in the beat frequencies.

FIG. 2A illustrates portion 200 of clocking system 100 with two inductor-capacitor (LC) oscillators that are inductively coupled causing drift in the beat frequencies. Here, LC oscillator 201 is part of VCO 101c while LC oscillator 202 is part of VCO 102c. Each LC oscillator includes p-type transistors MP1 and MP2, n-type transistors MN1 and MN2, inductor, capacitor, and current source CS. The inductor and capacitor pair of LC oscillator 201 is L1 and C1 while the inductor and capacitor pair of LC oscillator 202 is L2 and C2. The inductive coupling in this example is the mutual inductance between inductors L1 and L2. This mutual inductance modifies the inductances L1 and L2, which in turn modifies the output clock frequencies of Out_Clk1 and Out_Clk2, respectively. Unintentional modification of the output clock frequencies of Out_Clk1 and Out_Clk2 causes timing errors which lowers system performance.

Figures 2B, 2C:
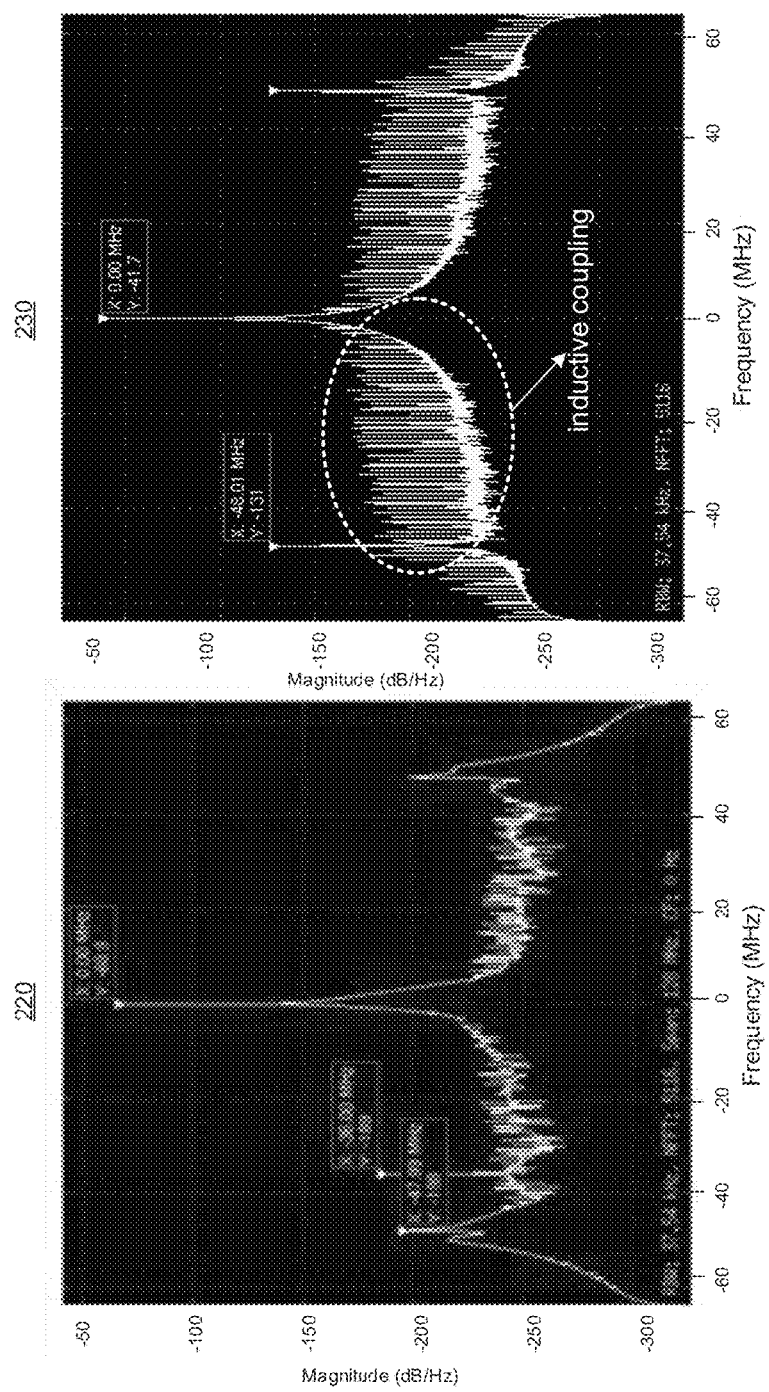
FIG. 2B illustrates a plot showing frequency spectrum of a PLL without inductive coupling.
FIG. 2C illustrates a plot showing a frequency spectrum of a PLL with inducting coupling.

FIG. 2B illustrates plot 220 showing frequency spectrum of a PLL without inductive coupling. Here, x-axis is Frequency (MHz) and y-axis is Magnitude in dB/Hz. FIG. 2C illustrates plot 230 showing a frequency spectrum of a PLL with inducting coupling.

Some embodiments describe an apparatus and method to mitigate the effects of inductive coupling between at least two clocking sources. Various embodiments also mitigate noise such as power supply noise induced by inductive coupling and large signal coupling that causes amplitude to phase modulation. In some embodiments, a calibration logic or circuit is provided which detects and extracts unwanted sideband frequency information and then uses that information to generate calibration codes for the clocking sources. In some embodiments, the calibration codes are acquired by a Least Means Square (LMS) scheme. In some embodiments, the calibration codes are applied to the clocking sources via their respective divider circuits. In some embodiments, the calibration codes are applied to the clocking sources that are phase and frequency locked.

There are many technical effects of the various embodiments. For example, some embodiments provide a digital solution to mitigating inductive coupling. A digital solution is generally better than an analog solution in that the digital solution is less sensitive towards process and supply variations and noise. Also, digital solutions can scale well over process nodes which reduces design time. The apparatus of some embodiments for mitigating inductive coupling allows for the clocking sources to be in close proximity to one another, which improves integration and allows for smaller sized System-on-Chips. Some embodiments apply the process of mitigating inductive coupling at cold boot or after clocking sources are phase-frequency locked. As such, power consumption is minimal. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 3:
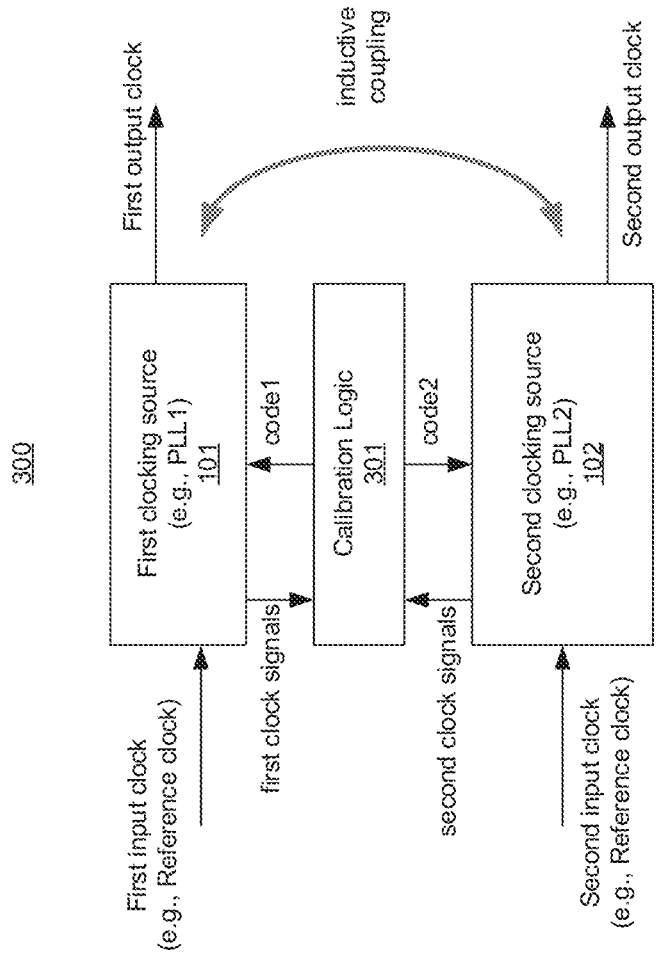
FIG. 3 illustrates a block diagram of a multi-clocking source system with calibration logic to mitigate inductive coupling, according to some embodiments of the disclosure.

FIG. 3 illustrates block diagram 300 of a multi-clocking source system with calibration logic to mitigate inductive coupling, according to some embodiments of the disclosure. It is pointed out that those elements of FIG. 3 having the same reference numbers (or names) as the elements of any other figure can operate or function in any manner similar to that described, but are not limited to such.

In some embodiments, the apparatus comprises a First clocking source (e.g., PLL1) 101, a Second clock source (e.g., PLL2) 102, and Calibration Logic 301. So as not to obscure the various embodiments, PLL1 101 and PLL2 102 are described with reference to being LCPLLs. However, the mitigating techniques for mitigating inductive coupling is applicable to any clocking source. For example, the mitigating techniques of various embodiments can also mitigate noise such as power supply noise induced by inductive coupling and large signal coupling that causes amplitude to phase modulation.

PLL1 101 receives a First input clock (e.g., Reference clock Ref_Clk1) and generates a First output clock Out_Clk1. PLL2 102 receives a Second input clock (e.g., Reference clock Ref_Clk2) and generates a Second output clock Out_Clk2. In some embodiments, Calibration Logic 301 receives first and second clock signals and other signals (such as PLL lock indicating signals) and processes them to generate code1 and code2 for PLL1 and PLL2, respectively. Here, the first clock signals include Ref_CLk1 and Fb_Clk1 while the second clock signals include Ref_Clk2 and Fb_Clk2. While various embodiments are described with respect to inductive coupling between the two clocking sources, the principals of various embodiments can be extended to any number of clocking sources that are inductively coupled (weakly or strongly).

They dynamics of PLL1 and PLL2 under influence of inductive coupling can be mathematically expressed as follows:

$$\frac{d\theta 1}{dt} = \omega 1 + KPLL1 * \left(\theta ref - \frac{\theta out}{N1}\right) + \alpha 1 * \sin(\omega diff * t + \beta 1)$$

$$\frac{d\theta 2}{dt} = \omega 2 + KPLL2 * \left(\theta ref - \frac{\theta out}{N2}\right) + \alpha 2 * \sin(\omega diff * t + \beta 2)$$

where ω1 is the central frequency of PLL1 (i.e., steady state frequency of Out_Clk1), KPLL1 is the gain of VCO 101c, θref is the phase of the Ref_Clk1, θout is the phase of the Out_Clk1, $$\frac{d\theta 1}{dt}$$

is the rate of change of the Out_Clk1, ω2 is the central frequency of PLL1 (i.e., steady state frequency of Out_Clk2), KPLL2 is the gain of VCO 102c, θout is the phase of the Out_Clk1, $$\frac{d\theta 2}{dt}$$

is the rate of change of the Out_Clk2, ωdiff is the beat frequency equal to |ω1−ω2|, β1 is phase difference of Ref_Clk1 and Fb_Clk1, β2 is the phase difference between Ref_Clk2 and Fb_Clk2, and α1 and α2 are parameters determined using Least Mean Square.

In some embodiments, Calibration Logic 301 applies correction code (or calibration code) which is equivalent to:

α1*sin(ωdiff*t+β1)

α2*sin(ωdiff*t+β2)

In some embodiments, this correction code (i.e., code1 and code2) is applied to the dividers 101d/102d of each PLL to mitigate the inductive coupling for reducing beat frequency or coupling In-band noise. In some embodiments, the correction code is applied to dividers 101d/e via their respective SDMs 101e/102e. In some embodiments, the correction codes adjust the divider ratios. In some embodiments, the correction code is applied to the output of Filters 101b/102b.

In some embodiments, Calibration Logic 301 applies the correction code to a PLL which is locked. For example, if PLL1 is locked while PLL2 is still locking, code1 is provided to PLL1 while code2 for PLL2 is held back. As such, PLL2 locking dynamics are not disturbed. After some time when PLL2 is locked, an updated code2 is provided to PLL2 to mitigate inductive coupling effects on Out_Clk2. Inductive coupling is generally weaker than large signal coupling which may cause Amplitude Modulation (AM) and Phase Modulation (PM) of Out_Clk1 and Out_Clk2. In some embodiments, the calibration codes (i.e., code1 and code2) also mitigate AM and PM at the same frequency using the same process and mechanism for mitigating weaker inductive or mutual coupling.

While the embodiments use a Sine function for describing the correction code, other functions can be used too. For example, Cosine function may be used instead of the Sine function to describe the correction code or combination of Sine and Cosine Function can be used as correction code.

Figure 4:
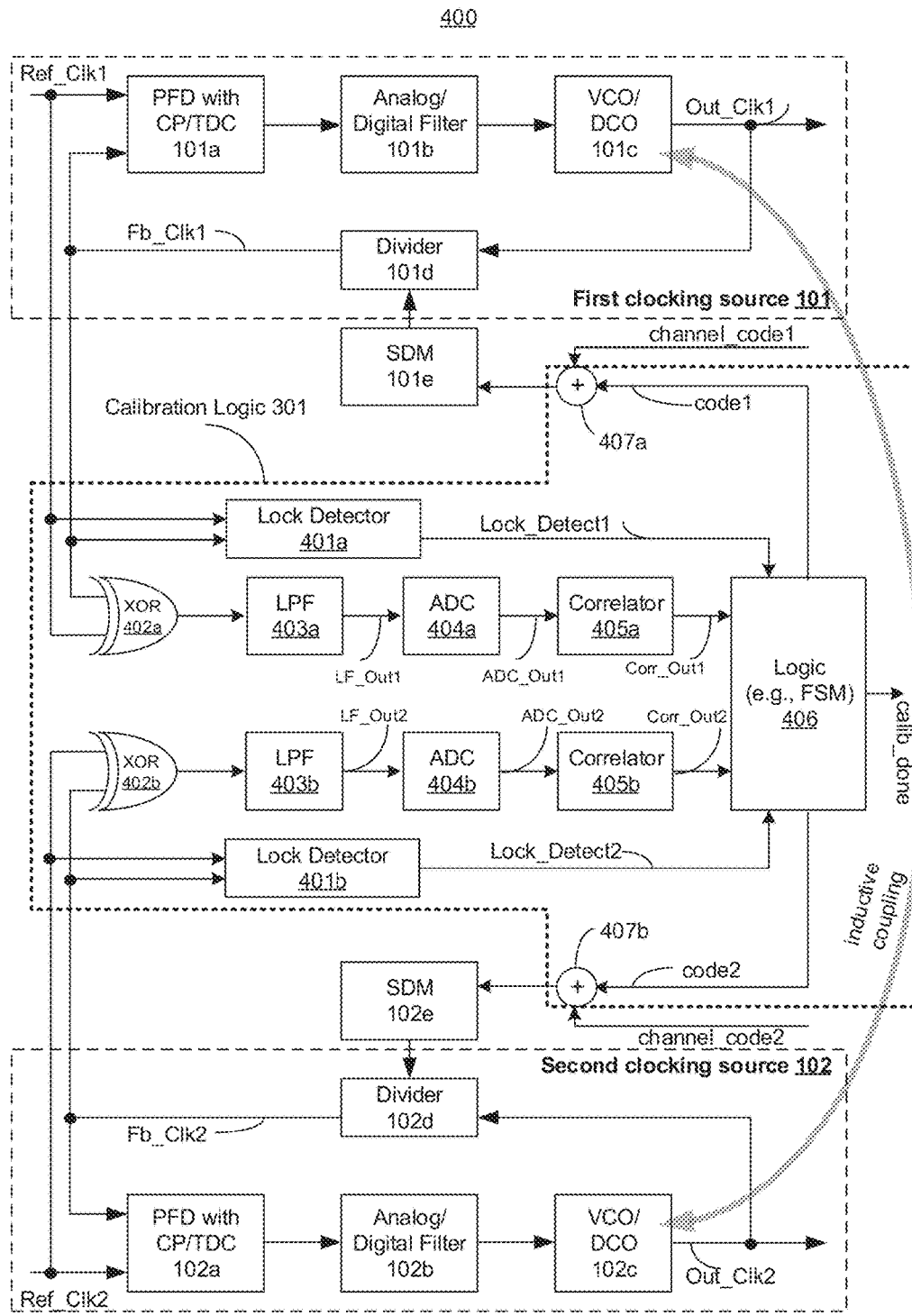
FIG. 4 illustrates details of the multi-clocking source system with the calibration logic to mitigate inductive coupling, according to some embodiments of the disclosure.

FIG. 4 illustrates multi-clocking source system 400 which shows the details of multi-clocking source system 300 with Calibration Logic 301 to mitigate inductive coupling, according to some embodiments of the disclosure. It is pointed out that those elements of FIG. 4 having the same reference numbers (or names) as the elements of any other figure can operate or function in any manner similar to that described, but are not limited to such. So as not to obscure the various embodiments, First clocking source 101 (i.e., PLL1) and Second clocking source 102 (i.e., PLL2) are not described in detail.

In some embodiments, Calibration Logic 301 comprises Lock Detectors 401a/b, first and second comparing logics 402a/b, Low-Pass Filters (LPFs) 403a/b, Analog-to-Digital Converters (ADCs) 404a/b, Correlators 405a/b, Finite State Machine logic 406, and Adder 407a/b.

In some embodiments, Lock Detectors 401a/b detect whether PLL1 101 and PLL2 102 are phase and frequency locked. In some embodiments, Lock Detectors 401a/b may be part of PLL1 101 and PLL2 102. In some embodiments, to avoid unintentional calibration for mitigating inductive coupling, outputs Lock_Detect1 and Lock_Detect2 are filtered outputs. In some embodiments, calibrations codes (i.e., code1 and code2) are provided for the locked PLL.

In some embodiments, first and second comparing logics 402a/b are exclusive-OR (XOR) logic gates that compare reference clocks with feedback clocks. For example, XOR 402a compares Ref_Clk1 against Fb_Clk1 while XOR 402b compares Ref_Clk2 against Fb_Clk2. One purpose of comparing reference clocks with feedback clocks is to extract the sideband frequency components. Here, labels for signals and nodes are interchangeably used. For example, Ref_Clk2 may refer to the node Ref_Clk2 or clock signal Ref_Clk2 depending on the context of the sentence.

In some embodiments, the outputs of XOR 402a/b are filtered by LPFs 403a/b, respectively. Any suitable active or passive or a mix of active and passive LPF may be used for implementing LPFs 403a/b. In some embodiments, the outputs of LPFs 403a/b are analog signals LF_Out1 and LF_Out2, respectively. An analog signal is any continuous signal for which the time varying feature (variable) of the signal is a representation of some other time varying quantity (i.e., analogous to another time varying signal). In some embodiments, LPFs 403a/b extract frequency information which is equivalent to the beat frequency of PLL1 and PLL2. As such, analog signals LF_Out1 and LF_Out2 represent the beat frequencies of PLL1 and PLL2, respectively.

In some embodiments, LF_Out1 and LF_Out2 are converted into respective digital representations ADC_Out1 and ADC_Out2 by ADCs 404a/b, respectively. ADCs are apparatuses that convert continuous physical quantities (e.g., voltages) to digital numbers that represent the amplitude of the physical quantities. In some embodiments, ADCs 404a/b convert the analog output of LPFs 403a/b to their corresponding digital representations. Any suitable ADC may be used to implement ADCs 404a/b.

For example, ADC 404a/b is one of: direct-conversion ADC (for flash ADC), two-step flash ADC, successive-approximation ADC (SAR ADC), ramp-compare ADC, Wilkinson ADC, integrating ADC, delta-encoded ADC or counter-ramp, pipeline ADC (also called subranging quantizer), sigma-delta ADC (also known as a delta-sigma ADC), time-interleaved ADC, ADC with intermediate FM stage, or time-stretch ADC, ring-oscillator based ADC, etc. For purposes of explaining the various embodiments, ADCs 404a/b are considered to be ring oscillator based ADCs, one of which is described with reference to FIG. 5.

Figure 5:
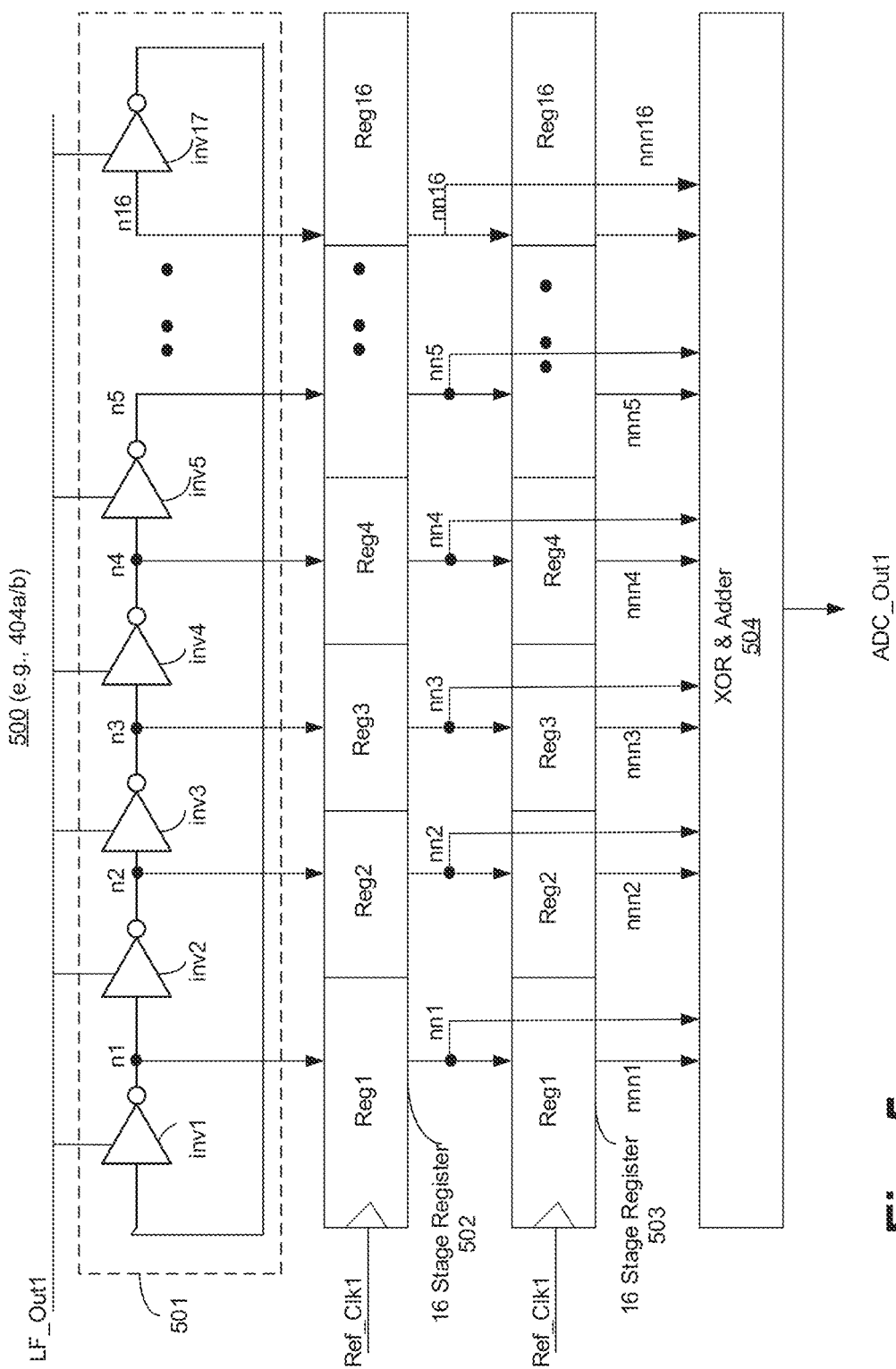
FIG. 5 illustrates a ring oscillator based Analog-to-Digital Converter (ADC) used by the calibration logic, according to some embodiments of the disclosure.
Figure 6A:
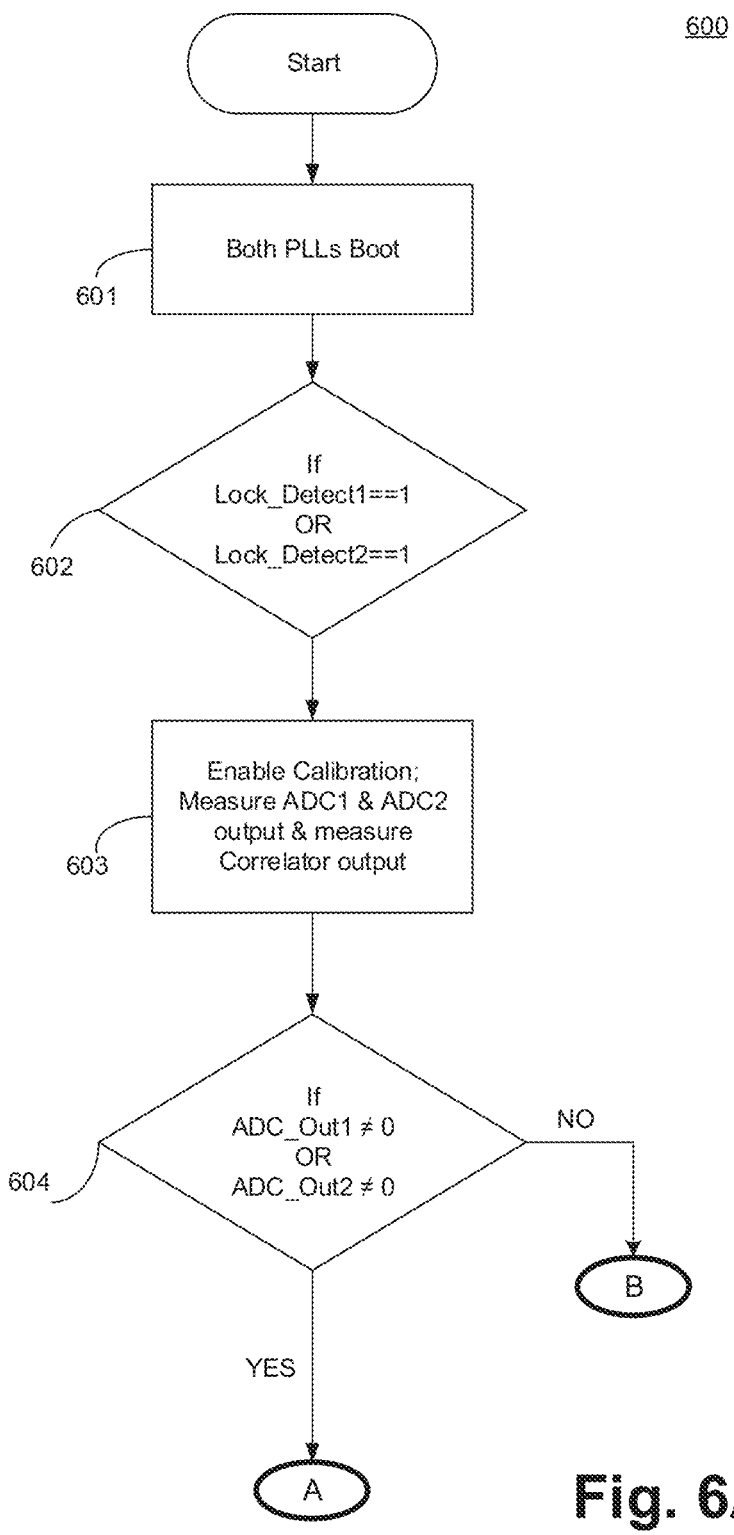
FIGS. 6A-E illustrate a flowchart of a method for mitigating coupling effects, according to some embodiments of the disclosure.
Figure 6B:
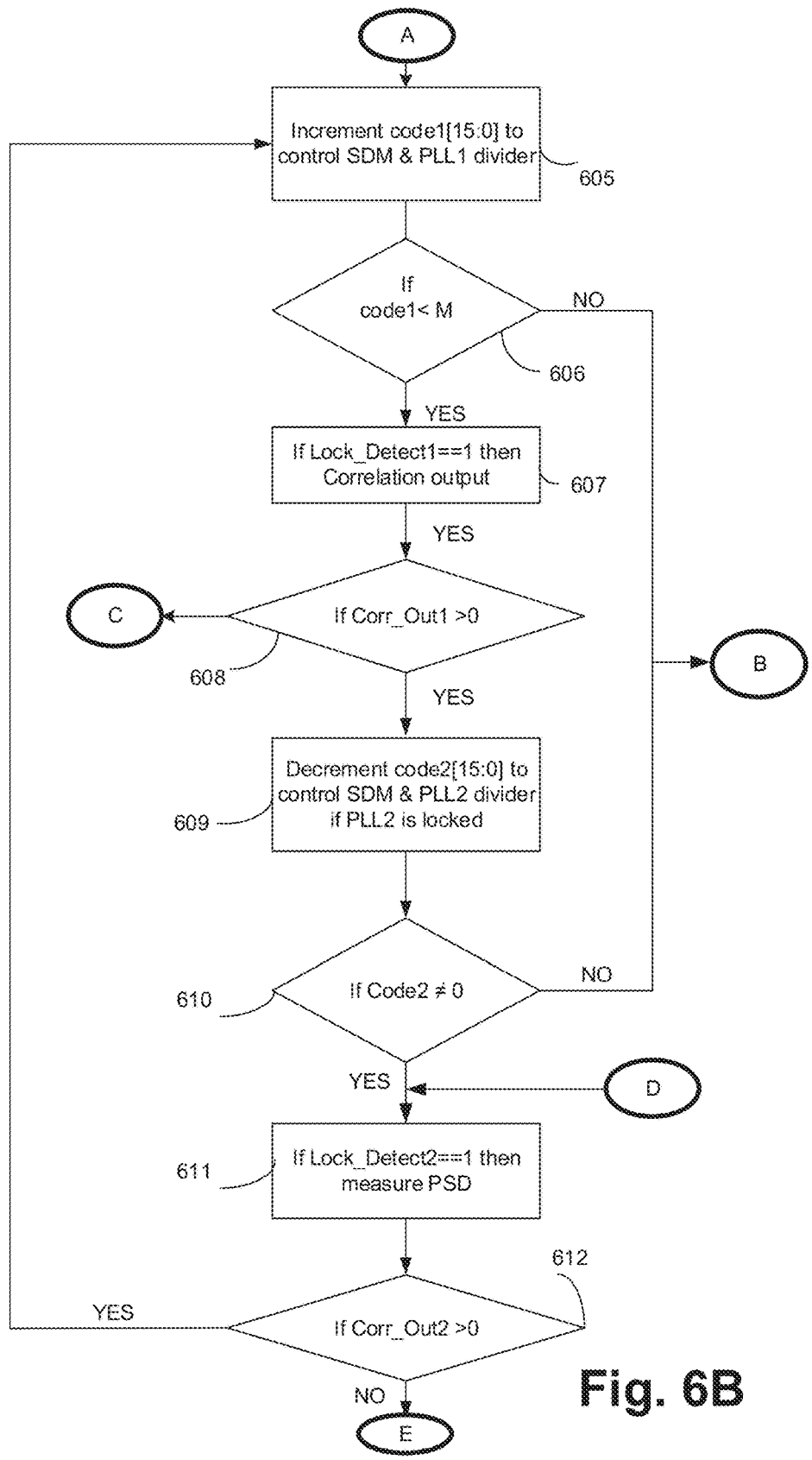
Figure 6C:
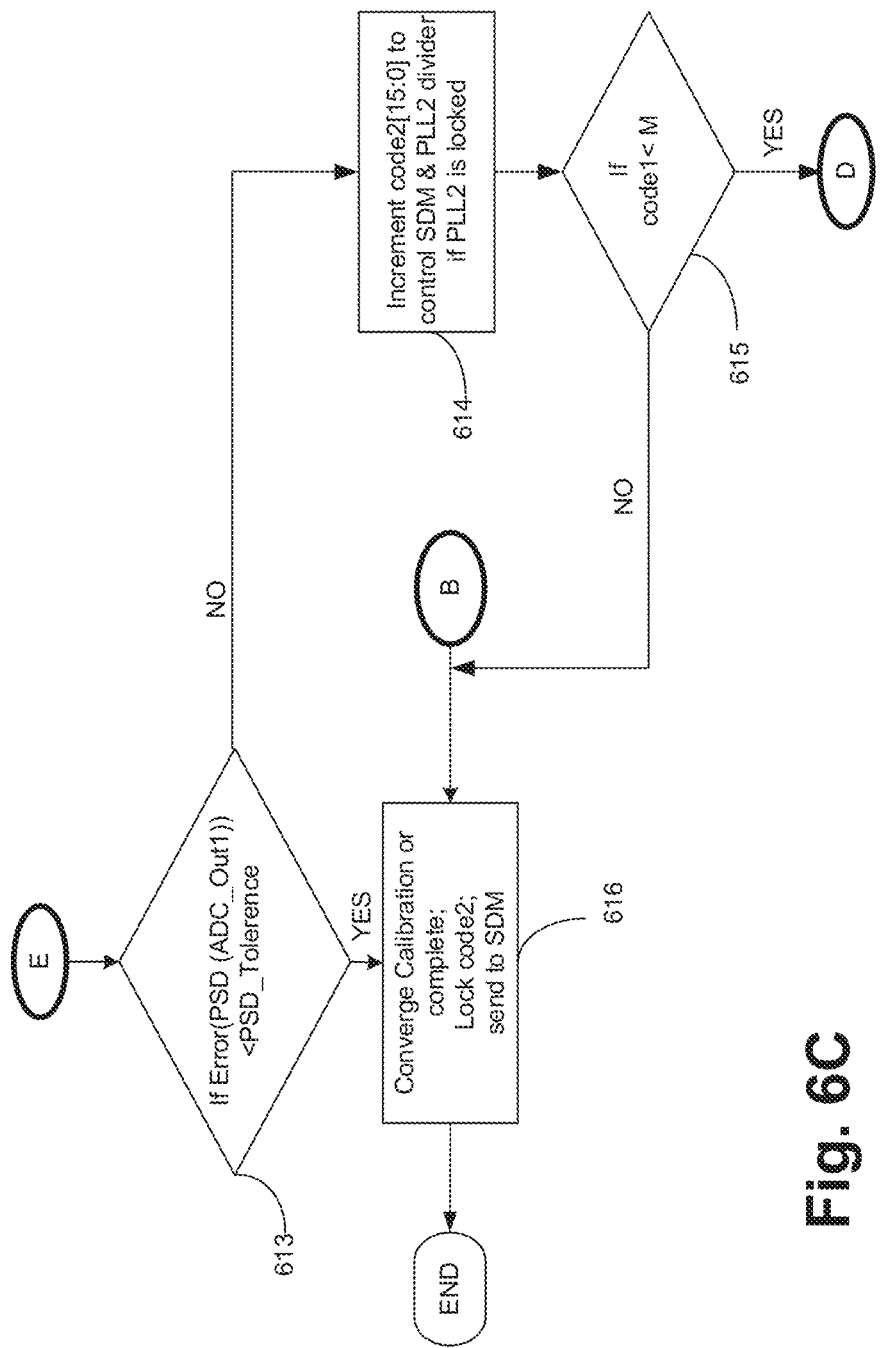
Figure 6D:
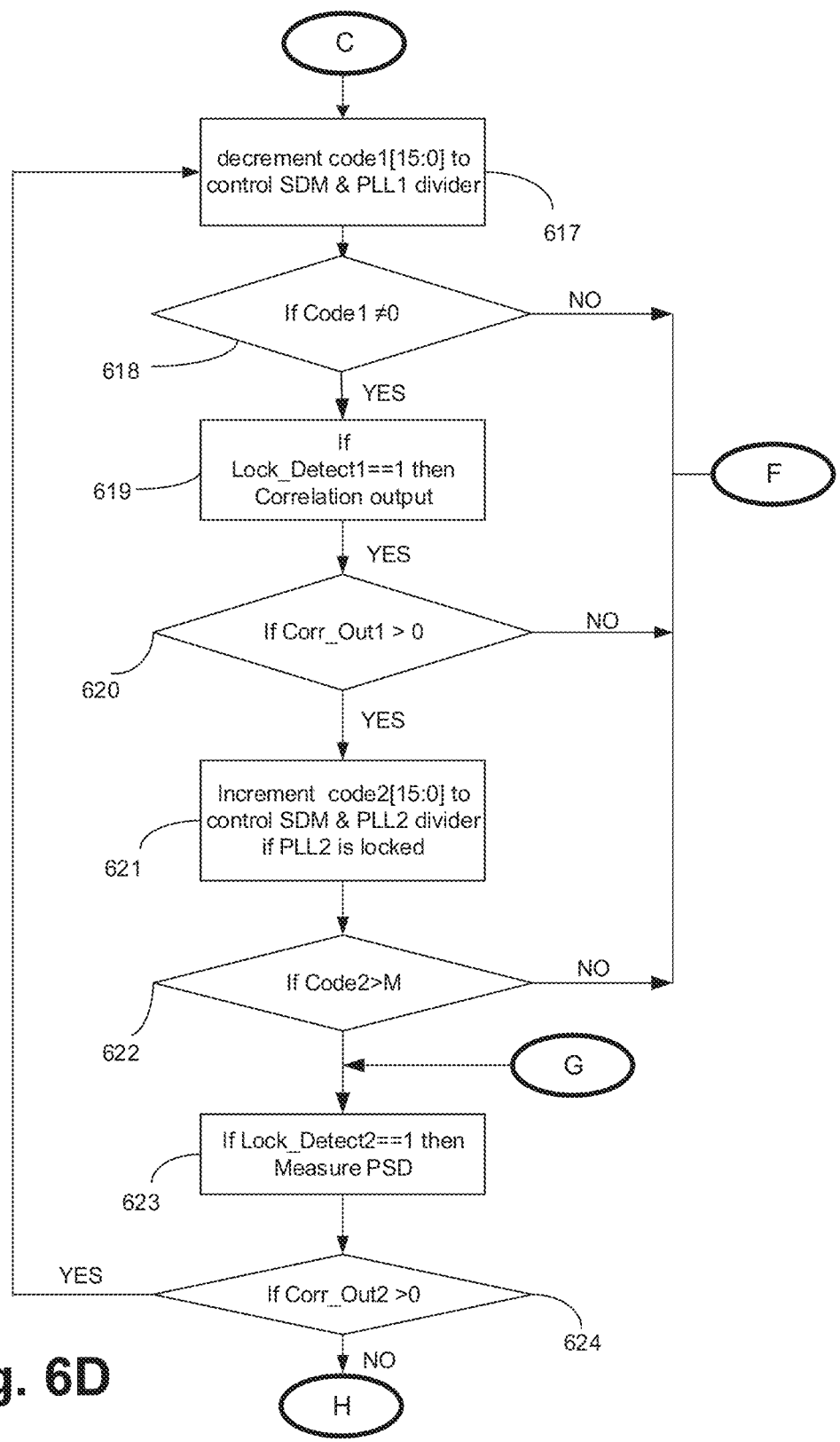
Figure 6E:
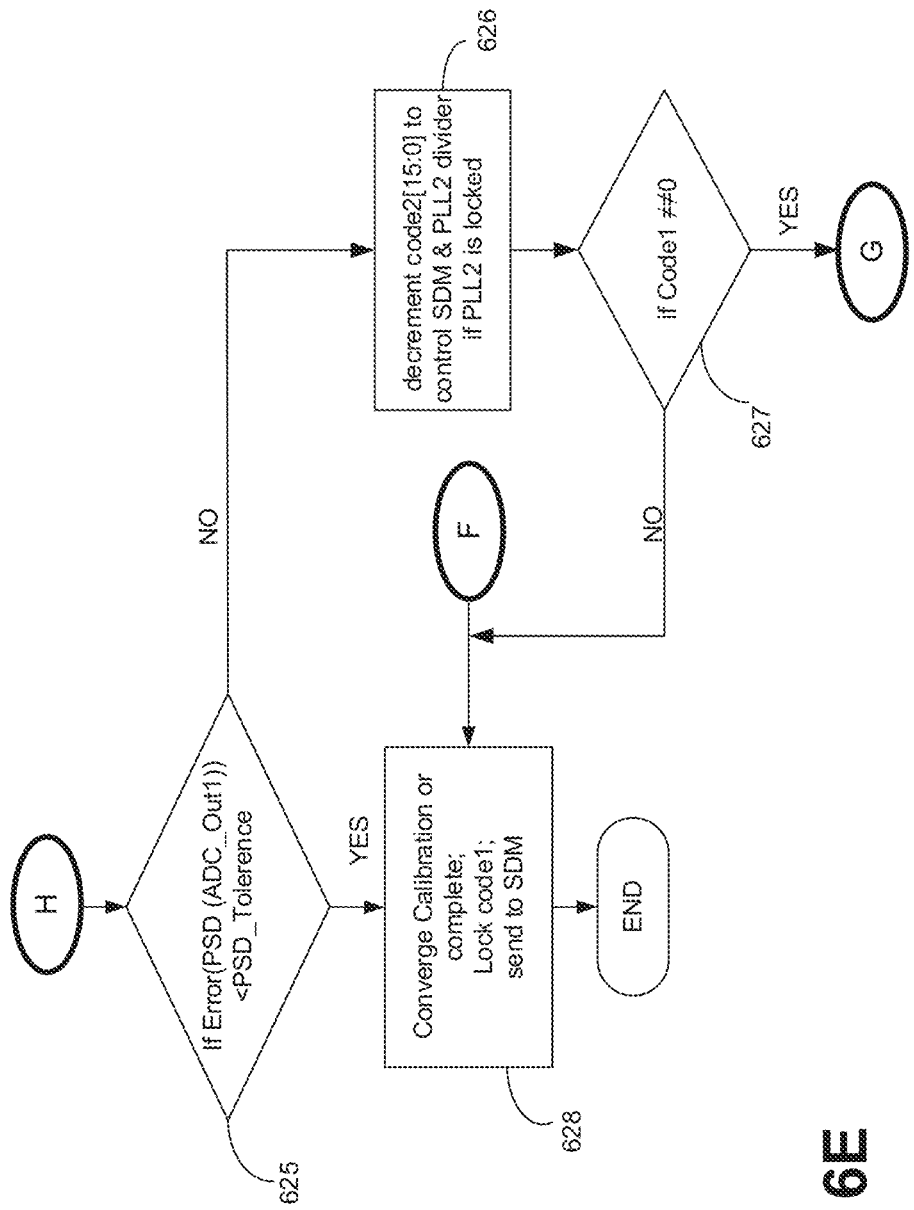

FIG. 5 illustrates a ring oscillator based ADC 500 (e.g., 404a/b) used by Calibration Logic 301, according to some embodiments of the disclosure. It is pointed out that those elements of FIG. 5 having the same reference numbers (or names) as the elements of any other figure can operate or function in any manner similar to that described, but are not limited to such.

In some embodiments, ADC 500 comprises ring oscillator 501 having a chain of inverting devices, first register stage 502, second register stage 503, XOR and Adder circuits 504 coupled together as shown. In some embodiments, the inverting devices of ring oscillator 501 are inverters inv1 to inv17 coupled together in a ring such that the output n17 of inv17 is fed back as input to inv1. In some embodiments, the power supply nodes of inverters inv1 to inv17 are coupled to the output of the LPF. In this example, ADC 404a is described and so LF_Out1 modulates the frequency of ring oscillator 501. The output of each inverter provides a phase which is then sampled by first register 502, in accordance with some embodiments. For example, phases provided by outputs n1, n2, n3, n4 . . . n16 are sampled using Ref_Clk1 by register 502.

In this example, seventeen stage ring oscillator 501 is illustrated. As such, first and second registers 502 and 503, respectively, are sixteen stage registers. In some embodiments, sampled outputs nn1, nn2, nn3, nn4 . . . nn16 are sampled again by second register 503 to generate sampled outputs mn1, mn2, mn3, mn4 . . . and mn16. In some embodiments, second register 503 samples outputs nn1, nn2, nn3, nn4 . . . nn16 which are are sampled by Ref_Clk1. By using two stages of registers 502 and 503, ADC resolution is improved. In some embodiments, the outputs of first and second registers 502 and 503 are logically XORed and then converted into digital information by XOR and Adder logic 504. In some embodiments, the output ADC_Out1 from XOR and Adder logic 504 is used for extracting sideband frequency component digitally.

Referring back to FIG. 4, in some embodiments, the outputs ADC_Out1 and ADC_Out2 are received by Correlator 405a/b, respectively. In some embodiments, Correlators 405a/b and digital circuits use the outputs ADC_Out1 and ADC_Out2 and determine increment or decrement signs (which are represented by outputs Corr_Out1 and Corr_Out2) for FSM 406. In some embodiments, Correlators 405a/b compare the past values of ADC_Out1 and ADC_Out2 with their current values to determine whether the values of ADC_Out1 and ADC_Out2 are increasing or decreasing. As such, Correlators 405a/b perform the function of differentiators, in accordance with some embodiments.

In some embodiments, FSM 406 receives the outputs Corr_Out1 and Corr_Out2 from Correlators 405a/b, and lock detection signals Lock_Detect1 and Lock_Detect2, and generates calibration codes code1 and code2 for PLL1 and PLL2, respectively. In some embodiments, FSM 406 updates the calibration codes for the locked PLLs. In some embodiments, the calibration codes are incremented or decremented according to the outputs Corr_Out1 and Corr_Out2 from Correlators 405a/b as described in more detail in FIGS. 6A-E.

Referring back to FIG. 4, in some embodiments, calibration codes are added by adders 407a/b with existing channel codes. For example, calibration code1 is added to channel_code1 by adder 407a and then the resultant output is provided to SDM 101e. Likewise, in some embodiments, calibration code2 is added to channel_code2 by adder 407b and then the resultant output is provided to SDM 102e. Here, channel_code corresponds to programmable fraction divider setting code for programming fraction divider value. In some embodiments, SDMs 101e/102e update the divider ratios of Dividers 101d/102d, respectively, to mitigate inductive coupling on Out_Clk1 and Out_Clk2, respectively. In some embodiments, calibration codes code1 and code2 are added to the outputs of Filters 101b/102b, respectively.

For example, when Filters 101b/102b are digital filters, calibration codes code1 and code2 can be added to the outputs of their corresponding filters to mitigate inductive coupling. In some embodiments, Calibration Logic 301 continues to sample the outputs of ADCs 404a/b to determine if sideband frequencies are still present. Once Logic 406 determines that sideband frequencies are not present or are below a predetermine threshold, FSM 406 locks the calibration codes for the locked PLLs and asserts a flag calb_done.

In some embodiments, XOR 402a, LPF 403a, ADC 404a, and Correlator 405a are placed in close proximity to PLL1 101. In some embodiments, XOR 402b, LPF 403b, ADC 404b, and Correlator 405b are placed in close proximity to PLL2 102. In some embodiments, FSM 406 can be shared between PLL1 and PLL2 or made as independent logic blocks for PLL1 and PLL2. In one such embodiment where FSM 406 is made as independent logic blocks for PLL1 and PLL2, those independent FSMs can be embedded inside each respective PLL. In some embodiments, Calibration Logic 301 also ensures that the calibration code provided to one PLL does not impact the other PLL such that the other PLL loses lock, for example.

FIGS. 6A-E illustrate flowchart 600 of a method for mitigating inductive coupling, according to some embodiments of the disclosure. It is pointed out that those elements of FIGS. 6A-E having the same reference numbers (or names) as the elements of any other figure can operate or function in any manner similar to that described, but are not limited to such.

Although the blocks in the flowchart with reference to FIGS. 6A-E are shown in a particular order, the order of the actions can be modified. Thus, the illustrated embodiments can be performed in a different order, and some actions/blocks may be performed in parallel. Some of the blocks and/or operations listed in FIGS. 6A-E are optional in accordance with certain embodiments. The numbering of the blocks presented is for the sake of clarity and is not intended to prescribe an order of operations in which the various blocks must occur. Additionally, operations from the various flows may be utilized in a variety of combinations.

The process of mitigating inductive coupling begins after both PLLs—PLL1 101 and PLL2 102—are booted (i.e., they start the process of locking) as shown by block 601, in accordance with some embodiments. If merely one PLL is booted and the other PLL is not on (i.e., the other PLL is powered off), then there is no inductive coupling that needs to be mitigated (assuming the case of the two PLLs). At block 602, the outputs Lock_Detect1 and Lock_Detect2 of Lock_Detectors 401a/b are monitored to determine if at least one of the PLLs is locked. The process of mitigating inductive coupling can begin when at least one PLL is locked while the other is locking, in accordance with some embodiments.

At block 603, FSM 406 is enabled for calibration. As such, Correlators 405a/b measure the outputs ADC_Out1 and ADC_Out2 of ADCs 404a/b to determine the sign for incrementing/decrementing code counts. At block 604, a determination is made whether the outputs of ADC are zero (i.e., ADC output count is checked). If either of ADC_Out1 or ADC_Out2 is not zero then the processor proceeds to block 605 (as illustrated by connection point A), otherwise the processor proceeds to block 616 (as indicated by connection point B).

At block 605, code1 is incremented by FSM 406 if PLL1 is locked. In this example, code1 is a 16-bit code represented by [15:0]. However, the size of the code can be any size depending on the resolution of adjusting the divider ratio. For example, the size of code1 can be 5 bits, 21 bits, etc. This code is provided to SDM 101e to modulate the divider ratio of Divider 101d of PLL1 101. In some embodiments, after incrementing code1, FSM 406 waits for PLL1 101 to relock if it loses lock.

At block 606, FSM 406 compares the value of code1 against a predetermined threshold 'M.' In this example, 'M' is ($2^{16}$−1) for 16 bits ADC output. In other examples, other values of 'M' may be used. Block 606 is performed to check for any overflow or underflow. If the value of code1 is less then 'M' then the process proceeds to block 607, otherwise the process proceeds to block 616 (as indicated by connection point B). If code1 is greater than M, code1 is overflowing. In that case correction code1 gives M value, which is the overflow limitation. The value of 'M' may be selected to be high to avoid overflow conditions.

At block 607, Lock_Detect1 is again monitored to make sure PLL1 is locked. If PLL1 is not locked, the process waits at block 607 for PLL1 to relock. If PLL1 is re-locked after application of code1, Corr_Out1 is monitored again. The process then proceeds to block 608. At block 608, a determination is made whether the output of Correlator 405a is greater than zero (i.e., whether Corr_Out1 is greater than zero). Correlator 405a measures the difference between previous vs. new ADC_Out1, in accordance with some embodiments. If Corr_Out1 is greater than zero, the process proceeds to block 609, otherwise the process proceeds to block 617 (as indicated by connection point C).

At block 609, code2 is decremented by FSM 406. This code is provided to SDM 102e to modulate the divider ratio of Divider 102d of PLL2 if PLL2 is locked, in accordance with some embodiments. At block 610, a determination is made by FSM 406 whether the value of code2 is not zero. If the value of code2 is not zero, then the process proceeds to block 611 otherwise the process proceeds to block 616 (as indicated by connection point B).

At block 611, FSM 406 checks whether PLL2 is still locked (i.e., whether the status of Lock_Detect2 is still a logic high). Because, code2 is applied to modulate the divider ratio of Divider 102d of PLL2, PLL2 may lose lock (i.e., Lock_Detect2 may de-assert indicating lack of lock). As such, at block 611 FSM 406 waits for PLL2 to relock before it analyzes the Power Spectral Density (PSD). Once PLL2 relocks (i.e., Lock_Detect2 is logic high), the process proceeds to block 612.

At block 612, a determination is made whether the output of Correlator 405b is greater than zero (i.e., whether Corr_Out2 is greater than zero). Here, Correlator 405b measures the difference between the previous and new ADC_Out2 values. If Corr_Out2 is greater than zero, then the process proceeds to block 605 and code1 is incremented if PLL1 is still locked. Otherwise, the process proceeds to block 613 (as indicated by connection point E).

At block 613, FSM 406 determines whether the error in PSD of ADC_Out1 is less than PSD_Tolerence. PSD_Tolerence provides the accuracy of mitigating noise. In some embodiments, PSD_Tolerance can be defined as (PSD_measured−PSD_required)/PSD_required expressed in terms of percentage. In some embodiments, PSD_Tolerance is programmable by hardware (e.g., fuses) and/or software (e.g., operating system). If the error is less than PSD_Tolerence, the processor proceeds to block 616, otherwise the error is high and the process proceeds to block 614. At block 616, code2 is locked (i.e., frozen till the next detection of inductive coupling) and calibration for code2 is considered complete. At block 614, FSM 406 increments code2 if PLL2 is locked. This code2 is provided to SDM 102e to modulate the divider ratio of Divider 102d of PLL2 102.

In some embodiments, after incrementing code2, FSM 406 waits for PLL2 to relock if it loses lock. The process then proceeds to block 615. At block 615, FSM 406 compares the value of code1 against the predetermined threshold 'M' (e.g., M=$2^N$−1, where 'N' is an integer). Block 615 is performed to check for any overflow or underflow. If the value of code1 is less then 'M' then the processor proceeds to block 611 (as indicated by connection point D), otherwise the process proceeds to block 616.

At block 617, code1 is decremented if PLL1 is locked. This code1 is provided to SDM 101e to modulate the divider ratio of Divider 101d of PLL 101. In some embodiments, after incrementing code1, FSM 406 waits for PLL1 to relock if it loses lock. At block 618, FSM 406 determines whether code1 is not zero. If code1 is not zero, the process proceeds to block 619, otherwise the process proceeds to block 628 (as indicated by connection point F).

At block 619, Lock_Detect1 is again monitored to make sure PLL1 is locked. If PLL1 is not locked, the process waits at block 619 for PLL1 to relock. If PLL1 is re-locked after application of code1, Corr_Out1 is monitored again. The process then proceeds to block 620. At block 620, a determination is made whether the output of Correlator 405a is greater than zero (i.e., whether Corr_Out1 is greater than zero). Correlator 405a measures the difference between previous vs. new ADC_Out1, in accordance with some embodiments. If Corr_Out1 is greater than zero, the process proceeds to block 621, otherwise the process proceeds to block 628 (as indicated by connection point F).

At block 621, code2 is incremented by FSM 406. This code is provided to SDM 102e to modulate divider ratio of Divider 102d of PLL2 if PLL2 is locked, in accordance with some embodiments. The process then proceeds to block 622. At block 622, FSM 406 compares the value of code2 against a predetermined threshold 'M' (e.g., $2^N-1$). Block 622 is performed to check for any overflow or underflow. If the value of code2 is less then 'M' then the process proceeds to block 623, otherwise the process proceeds to block 628 (as indicated by connection point F). At block 628, code1 is locked (i.e., frozen till the next detection of inductive coupling) and calibration for code1 is considered complete.

At block 623, FSM 406 checks whether PLL2 is still locked. Because, code2 is applied to modulate the divider ratio of Divider 102d of PLL2, PLL2 may lose lock (i.e., Lock_Detect2 may de-assert indicating lack of lock). As such, at block 623, FSM 406 waits for PLL2 to relock before it analyzes the PSD of Out_Clk2. Once PLL2 relocks, the process proceeds to block 624.

At block 624, a determination is made by FSM 406 whether Corr_Out2 is greater than zero. If Corr_Out2 is greater than zero then the process proceeds to block 617 otherwise the process proceeds to block 625 (as indicated by connection point H). Here, Correlator 405b measures the difference between the previous and new ADC_Out2 values.

At block 625, FSM 406 determines whether the error in PSD of ADC_Out1 is less than PSD_Tolerence. If the error is less than PSD_Tolerence, the process proceeds to block 628, otherwise the error is high and the process proceeds to block 626. At block 628, code2 is locked (i.e., frozen till the next detection of inductive coupling) and calibration for code2 is considered complete. At block 626, FSM 406 increments code2 if PLL2 is locked. This code2 is provided to SDM 102e to modulate the divider ratio of Divider 102d of PLL2 102.

In some embodiments, after incrementing code2, FSM 406 waits for PLL2 to relock if it loses lock. The process then proceeds to block 627. At block 627, FSM 406 determines whether code 1 is not equal to zero. If code1 is not equal to zero, the process proceeds to block 623 (as indicated by connection point G). If code1 is equal to zero, then the process proceeds to block 628. At block 628, code1 is locked and the calibration for PLL1 is considered complete. At block 628, code1 is locked (i.e., frozen till the next detection of inductive coupling) and the calibration for code1 is considered complete.

Figure 7:
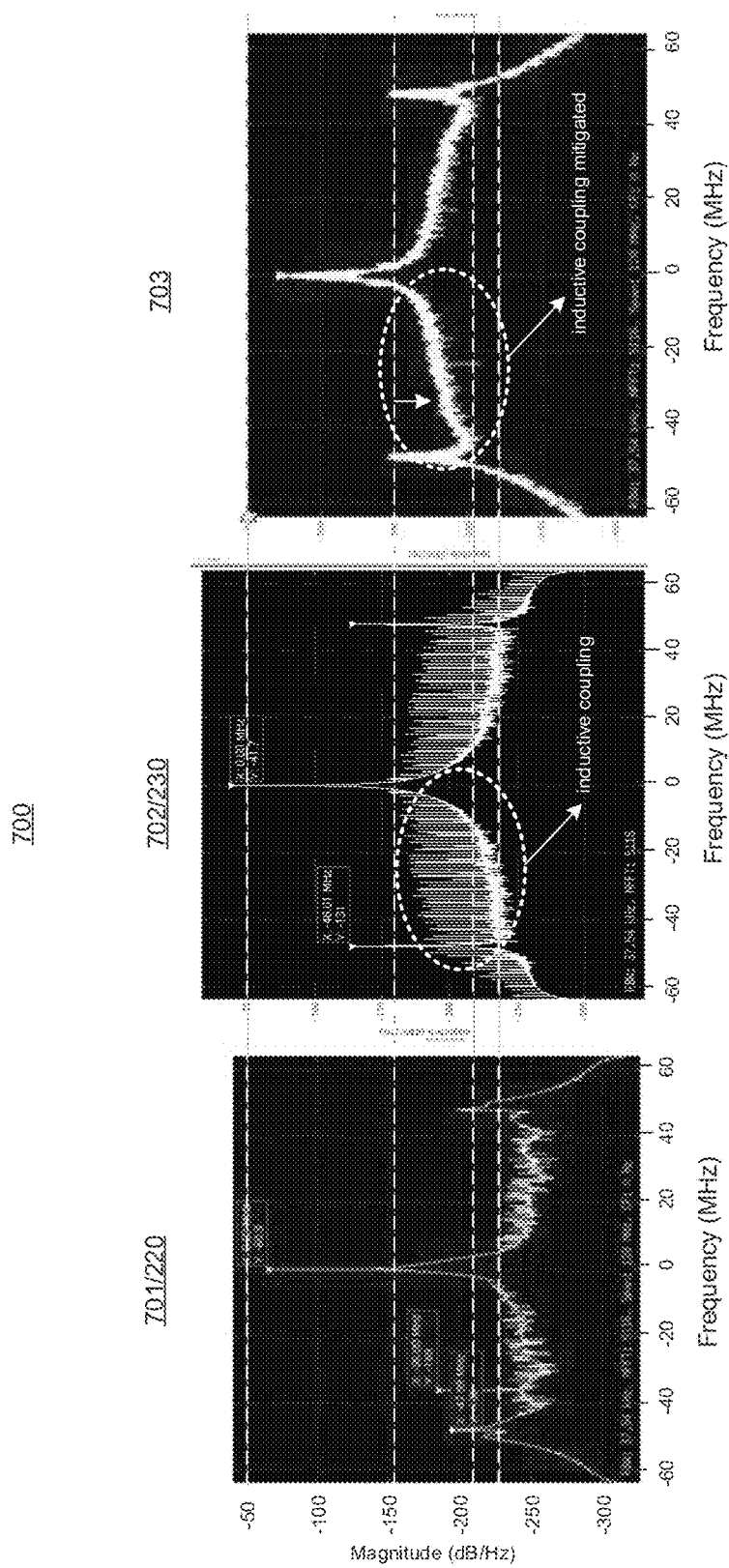
FIG. 7 illustrates frequency spectrum plots showing no inductive coupling, inductive coupling, and mitigation of inductive coupling, according to some embodiments of the disclosure.

FIG. 7 illustrates frequency spectrum plots 701 (same as plot 220), 702 (same as plot 230), and 703 showing no inductive coupling, inductive coupling, and mitigation of inductive coupling, respectively, according to some embodiments of the disclosure. It is pointed out that those elements of FIG. 7 having the same reference numbers (or names) as the elements of any other figure can operate or function in any manner similar to that described, but are not limited to such. Plot 703 shows that inductive coupling is mitigated by the apparatus and methods described here. In this example, 30 dB to 40 dB noise improvement is seen over plot 702. There may be a noise floor increase which can also be mitigated further by increasing ADC resolution and averaging.

Figure 8:
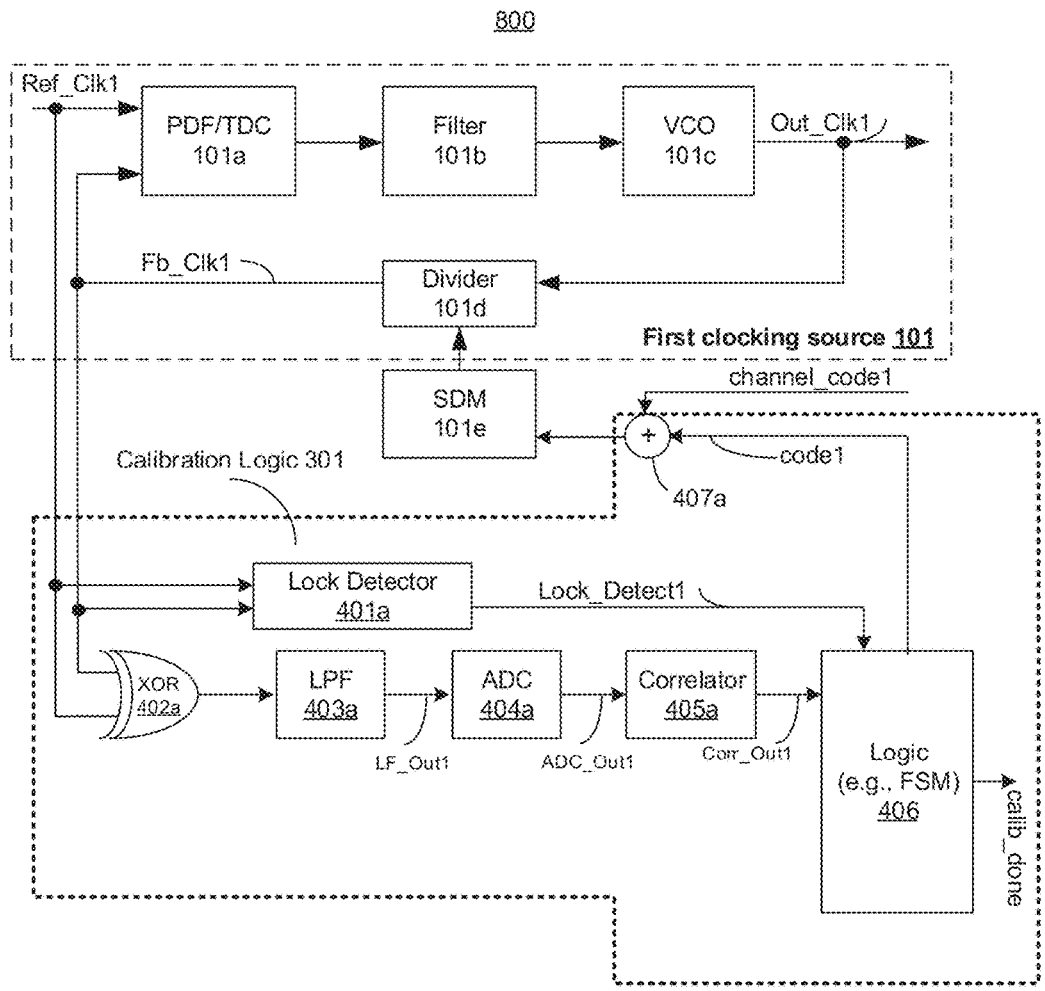
FIG. 8 illustrates details of a single-clocking source system with the calibration logic to mitigate inductive coupling, according to some embodiments of the disclosure.

FIG. 8 illustrates details of a single-clocking source system 800 with the calibration logic to mitigate indirect coupling, according to some embodiments of the disclosure. It is pointed out that those elements of FIG. 8 having the same reference numbers (or names) as the elements of any other figure can operate or function in any manner similar to that described, but are not limited to such. So as not to obscure the embodiment, differences between FIG. 8 and FIG. 4 are described.

Compared to multi-clocking source system 400, single-clocking source system 800 does not have the Second clocking source 102, in accordance with some embodiments. As such, Calibration Logic 301 is simplified because it does not have Lock_Detector 401b, XOR 402b, LFP 403b, ADC 404b, Correlator 405b, and adder 407b. In some embodiments, single-clocking source system 800 provides a solution to mitigate indirect coupling. For example, single-clocking source system 800 mitigates supply noise induced due to inductive coupling from various coupling sources such that the PLL or other switching sources (e.g., clock buffers).

Figure 9A:
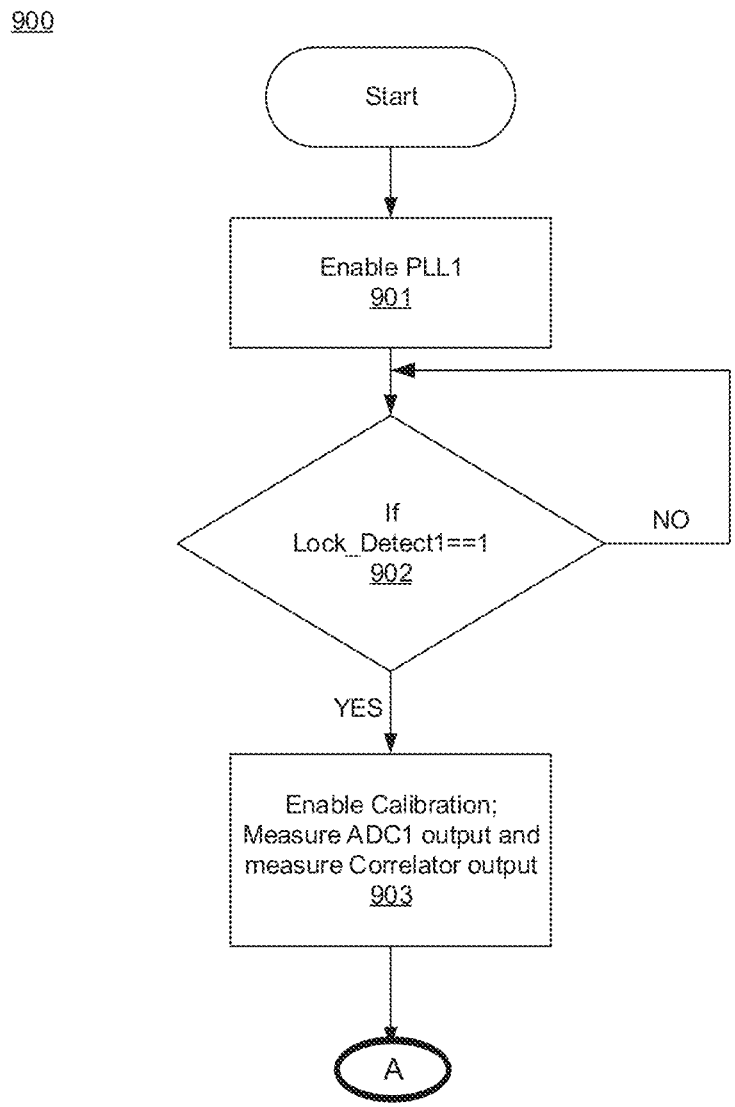
FIGS. 9A-C illustrate a flowchart of a method for mitigating supply noise, according to some embodiments of the disclosure.
Figure 9B:
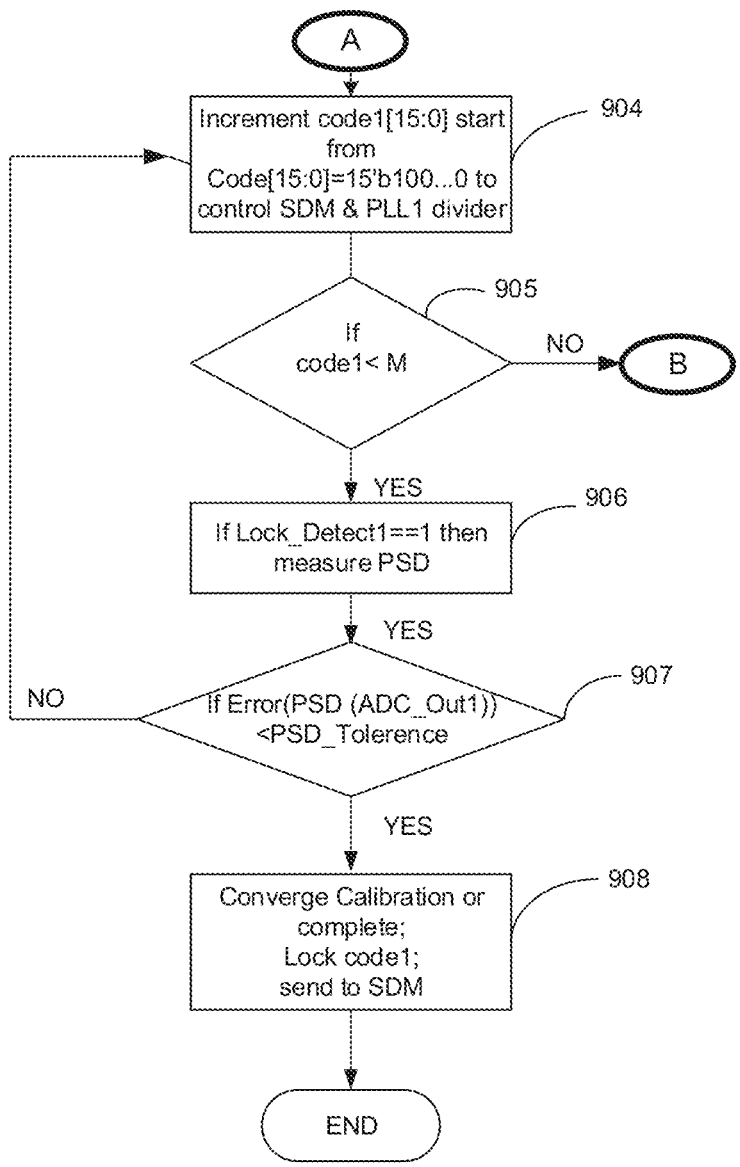
Figure 9C:
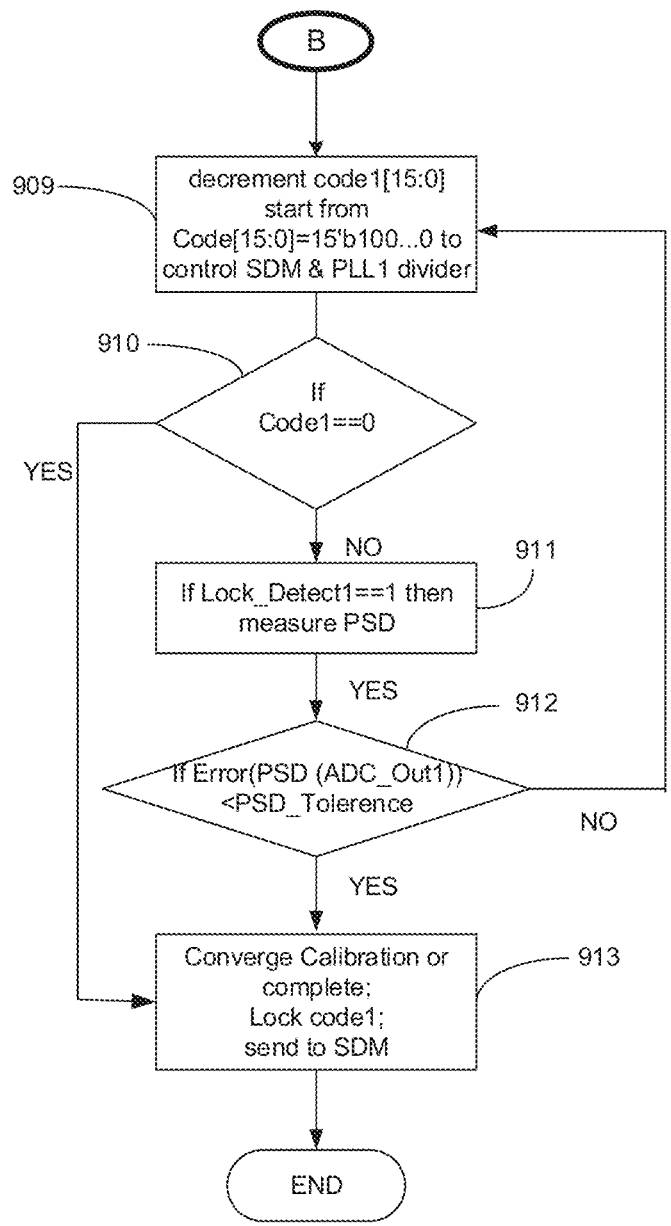

FIGS. 9A-C illustrate flowchart 900 of a method for mitigating supply noise, according to some embodiments of the disclosure. It is pointed out that those elements of FIGS. 9A-C having the same reference numbers (or names) as the elements of any other figure can operate or function in any manner similar to that described, but are not limited to such. FIGS. 9A-C are described with reference to FIG. 8.

Although the blocks in the flowchart with reference to FIGS. 9A-C are shown in a particular order, the order of the actions can be modified. Thus, the illustrated embodiments can be performed in a different order, and some actions/blocks may be performed in parallel. Some of the blocks and/or operations listed in FIGS. 9A-C are optional in accordance with certain embodiments. The numbering of the blocks presented is for the sake of clarity and is not intended to prescribe an order of operations in which the various blocks must occur. Additionally, operations from the various flows may be utilized in a variety of combinations.

The following process is describe with reference to mitigating supply noise originating from a supply line which is coupled to PLL1 101. The same process applies to mitigating supply noise from other sources.

The process of mitigating supply noise begins when PLL1 101 is booted (i.e., PLL1 starts the process of locking) as shown by block 901, in accordance with some embodiments. At block 902, the output Lock_Detect1 of Lock_Detectors 404a is monitored to determine if PLL1 101 is locked. The process of mitigating supply noise can begin when the PLL (i.e., the source of noise) is locked, in accordance with some embodiments.

At block 903, FSM 406 is enabled for calibration. As such, Correlator 405a measures the output ADC_Out1 of ADCs 404a to determine the sign for incrementing/decrementing code counts. The process then proceeds to block 904 as illustrated by connection point A.

At block 904, code1 is incremented by FSM 406. In this example, code1 is a 16-bit code represented by [15:0]. However, the size of the code can be any size depending on the resolution of adjusting the divider ratio. For example, the size of code1 can be 5 bits, 21 bits, etc. This code is provided to SDM 101e to modulate the divider ratio of Divider 101d of PLL 101. In some embodiments, after incrementing code1, FSM 406 waits for PLL1 to relock if it loses lock.

At block 905, FSM 406 compares the value of code1 against a predetermined threshold 'M.' In this example, 'M' is $(2^{16}-1)$ for 16 bits ADC output. In other examples, other values of 'M' may be used. Block 905 is performed to check for any overflow or underflow. If the value of code1 is less then 'M' then the process proceeds to block 906, otherwise the process proceeds to block 909 (as indicated by connection point B). If code1 is greater than 'M,' code1 is overflowing. In that case, code1 gives 'M' value, which is the overflow limitation. The value of 'M' may be selected to be high to avoid overflow conditions.

At block 906, Lock_Detect1 is again monitored to make sure PLL1 is locked. If PLL1 is not locked, the process waits at block 906 for PLL1 to relock. If PLL1 is re-locked after application of code1, Corr_Out1 is monitored again and PSD is measured or analyzed. The process then proceeds to block 907. At block 907, a determination At block 907, FSM 406 determines whether the error in PSD of ADC_Out1 is less than PSD_Tolerence. PSD_Tolerence provides the accuracy of mitigating supply noise. In some embodiments, PSD_Tolerence can be defined as (PSD_measured−PSD_required)/PSD_required expressed in terms of percentage. In some embodiments, PSD_Tolerence is programmable by hardware (e.g., fuses) and/or software (e.g., operating system). If the error is less than PSD_Tolerence, the process proceeds to block 908, otherwise the error is high and the process proceeds to block 904. At block 908, code1 is locked (i.e., frozen till the next detection of supply noise) and the calibration for code1 is considered complete. This code1 is provided to SDM 101e to modulate the divider ratio of Divider 102d of PLL 101.

At block 909, code1 is decremented. This code1 is provided to SDM 101e to modulate the divider ratio of Divider 101d of PLL 101. In some embodiments, after incrementing code1, FSM 406 waits for PLL1 to relock if it loses lock. At block 910, FSM 406 determines whether code1 is not zero. If code1 is not zero, the process proceeds to block 911, otherwise the process proceeds to block 913.

At block 911, Lock_Detect1 is again monitored to make sure PLL1 is locked. If PLL1 is not locked, the process waits at block 911 for PLL1 to relock. If PLL1 is re-locked after application of code1, Corr_Out1 is monitored again and PSD is measured. The process then proceeds to block 912.

At block 912, FSM 406 determines whether the error in PSD of ADC_Out1 is less than PSD_Tolerence. If the error is less than PSD_Tolerence, the process proceeds to block 913, otherwise the error is high and the process proceeds to block 909. At block 913, code1 is locked (i.e., frozen till next detection of supply noise) and calibration for code1 is considered complete. This code1 is provided to SDM 101e to modulate the divider ratio of Divider 101d of PLL 101. As such, the supply noise on PLL output is mitigated.

Figure 10:
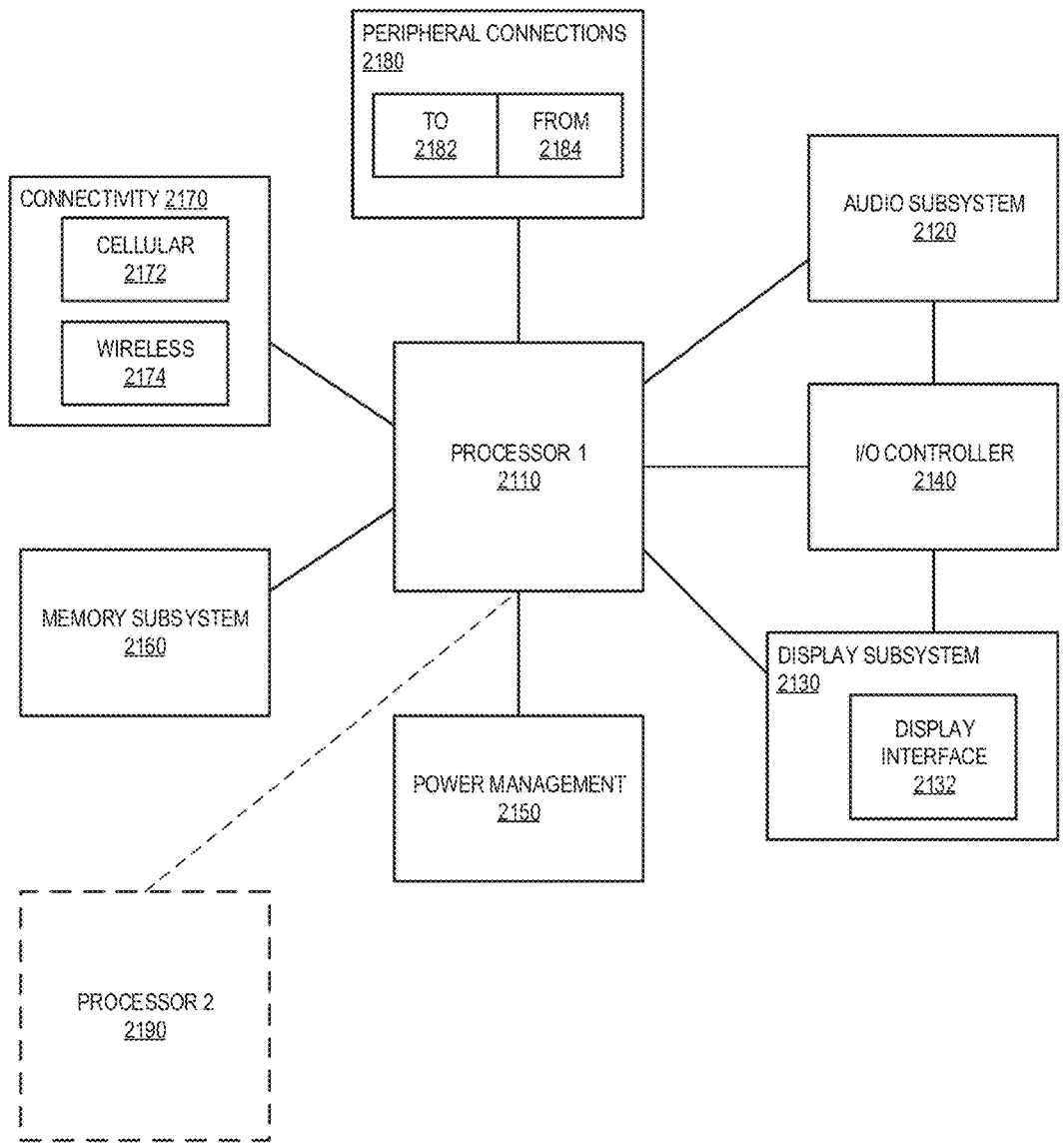
FIG. 10 illustrates a smart device or a computer system or a SoC (System-on-Chip) having apparatus to mitigate inductive coupling, according to some embodiments.

FIG. 10 illustrates a smart device or a computer system or a SoC (System-on-Chip) having apparatus to mitigate inductive coupling (such as coupled between two or more LCPLLs) and/or indirect coupling such as supply noise, according to some embodiments. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 having apparatus to mitigate inductive coupling (such as coupled between two or more LCPLLs) and/or indirect coupling such as supply noise, according to some embodiments discussed. Other blocks of the computing device 2100 may also include embodiment(s) to mitigate inductive coupling (such as coupled between two or more LCPLLs) and/or indirect coupling such as supply noise. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first clocking source having a first divider; a second clocking source having a second divider, wherein the first and second clocking sources are inductively coupled; and calibration logic to monitor clock signals associated with the first and second clocking sources and to generate at least one calibration code for adjusting at least one divider ratio of the first or second dividers according to the monitored clock signals.

In some embodiments, the apparatus comprises a first sigma-delta modulator to receive a first calibration code from the calibration logic, wherein the first sigma-delta modulator is operable to adjust a divider ratio of the first divider according to the first calibration code. In some embodiments, the first calibration code is generated according to the monitored clock signals. In some embodiments, the apparatus a second sigma-delta modulator to receive a second calibration code from the calibration logic, wherein the second sigma-delta modulator is operable to adjust a divider ratio of the second divider according to the second calibration code.

In some embodiments, the second calibration code is generated according to the monitored clock signals, and wherein the at least one calibration code is one of the first or second calibration codes. In some embodiments, the calibration logic comprises: a first comparing logic for comparing a first reference clock with a first feedback clock associated with the first clocking source; and a second comparing logic for comparing a second reference clock with a second feedback clock associated with the second clocking source, wherein the monitored clock signals include the first and second reference clocks and first and second feedback clocks.

In some embodiments, the calibration logic comprises: a first low pass filter coupled to the first comparing logic, wherein the first low pass filter is to filter an output of the first comparing logic; and a second low pass filter coupled to the second comparing logic, wherein the second low pass filter is to filter an output of the second comparing logic. In some embodiments, the calibration logic comprises: a first Analog-to-Digital Converter (ADC) coupled to the first low pass filter, wherein the first ADC is to convert an output of the first low pass filter to a first digital representation; and a second ADC coupled to the second low pass filter, wherein the second ADC is to convert an output of the second low pass filter to a second digital representation.

In some embodiments, the calibration logic comprises a finite state machine (FSM) to receive the first and second digital representations and to generate the first and second calibration codes according to the first and second digital representations. In some embodiments, first and second clocking sources are first and second phase locked loops (PLLs), respectively. In some embodiments, the calibration logic is to generate the at least one calibration code for the first or second PLLs depending on a locked condition of the first or second PLL.

In some embodiments, the first and second PLLs are first and second Inductor-Capacitor (LC) PLLs. In some embodiments, the first and second clocking sources are inductively coupled by at least one of: direct coupling by respective inductors of the first and second clock sources; indirect coupling by a power supply rail shared by the first and second clock sources; large signal coupling that causes amplitude modulation to outputs of the first and second clock sources; or large signal coupling that causes phase modulation to the outputs of the first and second clock sources.

In another example, a system is provided which comprises: a memory' a processor coupled to the memory, the processor including an apparatus according to the apparatus described above; and a wireless interface for allowing the processor to communicate with another device.

In another example, an apparatus is provided which comprises: a first Inductor-Capacitor Phase Locked Loop (LCPLL) having a first divider controllable by a first sigma-delta modulator; a second LCPLL having a second divider controllable by a second sigma-delta modulator, wherein the first and second LCPLLs are inductively coupled by respective inductors of the first and second LCPLLs; and a calibration logic to monitor reference and feedback signals, for each of the first and second LCPLLs, and to generate calibration codes for the first and second sigma-delta modulators according to the monitored reference and feedback signals and on locked conditions of the first and second LCPLLs.

In some embodiments, the calibration logic comprises: a first XOR gate for comparing the reference and feedback signals associated with the first LCPLL; and a second XOR gate for comparing the reference and feedback signals associated with the second LCPLL. In some embodiments, the calibration logic comprises: a first low pass filter coupled to the first XOR gate, wherein the first low pass filter is to filter an output of the first XOR gate; and a second low pass filter coupled to the second XOR gate, wherein the second low pass filter is to filter an output of the second XOR gate.

In some embodiments, the calibration logic comprises: a first Analog-to-Digital Converter (ADC) coupled to the first low pass filter, wherein the first ADC is to convert an output of the first low pass filter to a first digital representation; and a second ADC coupled to the second low pass filter, wherein the second ADC is to convert an output of the second low pass filter to a second digital representation. In some embodiments, the calibration logic comprises a finite state machine (FSM) to receive the first and second digital representations and to generate the calibration codes according to the first and second digital representations.

In another example, a system is provided which comprises: a memory' a processor coupled to the memory, the processor including an apparatus according to the apparatus described above; and a wireless interface for allowing the processor to communicate with another device.

In another example, a method is provided which comprises: monitoring clock signals associated with first and second clocking sources, wherein the first clocking source has a first divider, wherein the second clocking source has a second divider, and wherein the first and second clocking sources are inductively coupled; and generating at least one calibration code for adjusting at least one divider ratio of the first or second dividers according to the monitored clock signals.

In some embodiments, the method comprises: receiving a first calibration code by a first sigma-delta modulator which is operable to adjust a divider ratio of the first divider according to the first calibration code. In some embodiments, the method comprises: generating the first calibration code according to the monitored clock signals. In some embodiments, the method comprises: receiving a second calibration code by a second sigma-delta modulator, wherein the second sigma-delta modulator is operable to adjust a divider ratio of the second divider according to the second calibration code.

In some embodiments, the method comprises: generating the second calibration code according to the monitored clock signals, and wherein the at least one calibration code is one of the first or second calibration codes. In some embodiments, the method comprises: comparing a first reference clock with a first feedback clock associated with the first clocking source; and comparing a second reference clock with a second feedback clock associated with the second clocking source; wherein the monitored clock signals include the first and second reference clocks and first and second feedback clocks.

In some embodiments, the first and second clocking sources are inductively coupled by at least one of: direct coupling by respective inductors of the first and second clock sources; indirect coupling by a power supply rail shared by the first and second clock sources; large signal coupling that causes amplitude modulation to outputs of the first and second clock sources; or large signal coupling that causes phase modulation to the outputs of the first and second clock sources.

In another example, an apparatus is provided which comprises: means for monitoring clock signals associated with first and second clocking sources, wherein the first clocking source has a first divider, wherein the second clocking source has a second divider, and wherein the first and second clocking sources are inductively coupled; and means for generating at least one calibration code for adjusting at least one divider ratio of the first or second dividers according to the monitored clock signals.

In some embodiments, the apparatus comprises: means for receiving a first calibration code, wherein the means for receiving the first calibration code is operable to adjust a divider ratio of the first divider according to the first calibration code; and means for generating the first calibration code according to the monitored clock signals. In some embodiments, the apparatus comprises: means for receiving a second calibration code, wherein the means for receiving the second calibration code is operable to adjust a divider ratio of the second divider according to the second calibration code.

In some embodiments, the apparatus comprises: means for generating the second calibration code according to the monitored clock signals, and wherein the at least one calibration code is one of the first or second calibration codes. In some embodiments, the apparatus comprises: means for comparing a first reference clock with a first feedback clock associated with the first clocking source; and means for comparing a second reference clock with a second feedback clock associated with the second clocking source; wherein the monitored clock signals include the first and second reference clocks and first and second feedback clocks.

In some embodiments, the first and second clocking sources are inductively coupled by at least one of: direct coupling by respective inductors of the first and second clock sources; indirect coupling by a power supply rail shared by the first and second clock sources; large signal coupling that causes amplitude modulation to outputs of the first and second clock sources; or large signal coupling that causes phase modulation to the outputs of the first and second clock sources.

In another example, a system is provided which comprises: a memory' a processor coupled to the memory, the processor including an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
   a first clocking source having a first divider;
   a second clocking source having a second divider, wherein the first and second clocking sources are close enough in proximity to one another such that they are inductively coupled to one another; and
   calibration logic to monitor clock signals associated with the first and second clocking sources and to generate at least one calibration code to adjust at least one divider ratio of the first or second dividers according to the monitored clock signals; and
   a sigma-delta modulator to receive the at least one calibration code from the calibration logic, wherein the at least one calibration code is generated according to the monitored clock signals.

2. The apparatus of claim 1, wherein the sigma-delta modulator is operable to adjust a divider ratio of the first divider according to the at least one calibration code.

3. The apparatus of claim 2, wherein the sigma-delta modulator is a first sigma-delta modulator, wherein the at least one calibration code is a first calibration code, wherein the apparatus comprises a second sigma-delta modulator to receive a second calibration code from the calibration logic, and wherein the second sigma-delta modulator is operable to adjust a divider ratio of the second divider according to the second calibration code.

4. The apparatus of claim 3, wherein the second calibration code is generated according to the monitored clock signals.

5. The apparatus of claim 3, wherein the calibration logic comprises:
   a first comparing logic for comparing a first reference clock with a first feedback clock associated with the first clocking source; and
   a second comparing logic for comparing a second reference clock with a second feedback clock associated with the second clocking source,
   wherein the monitored clock signals include the first and second reference clocks and first and second feedback clocks.

6. The apparatus of claim 5, wherein the calibration logic comprises:
   a first low pass filter coupled to the first comparing logic, wherein the first low pass filter is to filter an output of the first comparing logic; and
   a second low pass filter coupled to the second comparing logic, wherein the second low pass filter is to filter an output of the second comparing logic.

7. The apparatus of claim 6, wherein the calibration logic comprises:
   a first Analog-to-Digital Converter (ADC) coupled to the first low pass filter, wherein the first ADC is to convert an output of the first low pass filter to a first digital representation; and
   a second ADC coupled to the second low pass filter, wherein the second ADC is to convert an output of the second low pass filter to a second digital representation.

8. The apparatus of claim 7, wherein the calibration logic comprises a finite state machine (FSM) to receive the first and second digital representations and to generate the first and second calibration codes according to the first and second digital representations.

9. The apparatus of claim 1, wherein first and second clocking sources are first and second phase locked loops (PLLs), respectively.

10. The apparatus of claim 9, wherein the calibration logic is to generate the at least one calibration code for the first or second PLLs depending on a locked condition of the first or second PLL.

11. The apparatus of claim 9, wherein the first and second PLLs are first and second Inductor-Capacitor (LC) PLLs.

12. The apparatus of claim 1, wherein the first and second clocking sources are inductively coupled by at least one of:
   direct coupling by respective inductors of the first and second clock sources;
   indirect coupling by a power supply rail shared by the first and second clock sources;
   large signal coupling that causes amplitude modulation to outputs of the first and second clock sources; or
   large signal coupling that causes phase modulation to the outputs of the first and second clock sources.

13. An apparatus comprising:
   a first Inductor-Capacitor Phase Locked Loop (LCPLL) having a first divider controllable by a first sigma-delta modulator;
   a second LCPLL having a second divider controllable by a second sigma-delta modulator, wherein the first and second LCPLLs are close enough in proximity to one another that they are inductively coupled to one another by respective inductors of the first and second LCPLLs; and
   a calibration logic to monitor reference and feedback signals, for each of the first and second LCPLLs, and to generate calibration codes for the first and second sigma-delta modulators according to the monitored reference and feedback signals and on locked conditions of the first and second LCPLLs.

14. The apparatus of claim 13, wherein the calibration logic comprises:
   a first eclusive-OR (XOR) gate for comparing the reference and feedback signals associated with the first LCPLL; and
   a second XOR gate for comparing the reference and feedback signals associated with the second LCPLL.

15. The apparatus of claim 14, wherein the calibration logic comprises:
   a first low pass filter coupled to the first XOR gate, wherein the first low pass filter is to filter an output of the first XOR gate; and
   a second low pass filter coupled to the second XOR gate, wherein the second low pass filter is to filter an output of the second XOR gate.

16. The apparatus of claim 15, wherein the calibration logic comprises:
   a first Analog-to-Digital Converter (ADC) coupled to the first low pass filter, wherein the first ADC is to convert an output of the first low pass filter to a first digital representation; and
   a second ADC coupled to the second low pass filter, wherein the second ADC is to convert an output of the second low pass filter to a second digital representation.

17. The apparatus of claim 16, wherein the calibration logic comprises a finite state machine (FSM) to receive the first and second digital representations and to generate the calibration codes according to the first and second digital representations.

18. A system comprising:
   a memory;
   a processor coupled to the memory, the processor including:
      a first clocking source having a first divider;
      a second clocking source having a second divider, wherein the first and second clocking sources are close enough in proximity to one another such that they are inductively coupled to one another; and
      calibration logic to monitor clock signals associated with the first and second clocking sources and to generate at least one calibration code to adjust at least one divider ratio of the first or second dividers according to the monitored clock signals; and
      a first sigma-delta modulator to receive a first calibration code from the calibration logic, wherein the first calibration code is generated according to the monitored clock signals; and
   a wireless interface to allow the processor to communicate with another device.

19. The system of claim 18, wherein the first and second clocking sources are inductively coupled by at least one of:
   direct coupling by respective inductors of the first and second clock sources;
   indirect coupling by a power supply rail shared by the first and second clock sources;
   large signal coupling that causes amplitude modulation to outputs of the first and second clock sources; or
   large signal coupling that causes phase modulation to the outputs of the first and second clock sources.

20. An apparatus comprising:
   a first clocking source having a first divider;
   a second clocking source having a second divider, wherein the first and second clocking sources are inductively coupled to one another;
   calibration logic to monitor clock signals associated with the first and second clocking sources;
   a first sigma-delta modulator to receive a first calibration code from the calibration logic, wherein the first calibration code is generated according to the monitored clock signals, wherein the first sigma-delta modulator is operable to adjust a divider ratio of the first divider according to the first calibration code; and
   a second sigma-delta modulator to receive a second calibration code from the calibration logic, wherein the second sigma-delta modulator is operable to adjust a divider ratio of the second divider according to the second calibration code;
   wherein the calibration logic comprises:
      a first comparing logic for comparing a first reference clock with a first feedback clock associated with the first clocking source;
      a second comparing logic for comparing a second reference clock with a second feedback clock associated with the second clocking source, wherein the monitored clock signals include the first and second reference clocks and first and second feedback clocks;
      a first low pass filter coupled to the first comparing logic, wherein the first low pass filter is to filter an output of the first comparing logic; and
      a second low pass filter coupled to the second comparing logic, wherein the second low pass filter is to filter an output of the second comparing logic.

21. The apparatus of claim 20, wherein the calibration logic comprises:

a first Analog-to-Digital Converter (ADC) coupled to the first low pass filter, wherein the first ADC is to convert an output of the first low pass filter to a first digital representation; and a second ADC coupled to the second low pass filter, wherein the second ADC is to convert an output of the second low pass filter to a second digital representation.

22. The apparatus of claim 21, wherein the calibration logic comprises a finite state machine (FSM) to receive the first and second digital representations and to generate the first and second calibration codes according to the first and second digital representations, respectively.

23. The apparatus of claim 20, wherein first and second clocking sources are first and second phase locked loops (PLLs), respectively.

24. The apparatus of claim 20, wherein the first and second clocking sources are inductively coupled by at least one of:

direct coupling by respective inductors of the first and second clock sources;

indirect coupling by a power supply rail shared by the first and second clock sources;

large signal coupling that causes amplitude modulation to outputs of the first and second clock sources; or large signal coupling that causes phase modulation to the outputs of the first and second clock sources.

* * * * *